(12) United States Patent
Woywod et al.

(10) Patent No.: US 12,269,645 B2
(45) Date of Patent: Apr. 8, 2025

(54) COATED GLASS ELEMENT

(71) Applicant: Schott AG, Mainz (DE)

(72) Inventors: Tanja Woywod, Mainz (DE); Eveline Rudigier-Voigt, Mainz (DE); Jovana Djordjevic-Reiß, Mainz (DE); Uwe Rothhaar, Birkenheide (DE); Michaela Klause, Mainz (DE); Sylvia Biedenbender, Bingen (DE); Hartmut Bauch, Mommenheim (DE)

(73) Assignee: Schott AG, Mainz (DE)

( * ) Notice: Subject to any disclaimer, the term of this patent is extended or adjusted under 35 U.S.C. 154(b) by 224 days.

(21) Appl. No.: 17/704,590

(22) Filed: Mar. 25, 2022

(65) Prior Publication Data
US 2022/0315284 A1    Oct. 6, 2022

(30) Foreign Application Priority Data

Mar. 25, 2021   (EP) .................................. 21164787

(51) Int. Cl.
| | |
|---|---|
| B65D 23/02 | (2006.01) |
| A61J 1/14 | (2023.01) |
| C03C 17/00 | (2006.01) |

(52) U.S. Cl.
CPC ............ B65D 23/02 (2013.01); A61J 1/1468 (2015.05); C03C 17/004 (2013.01); C03C 2217/70 (2013.01)

(58) Field of Classification Search
CPC ....... Y10T 428/31667; Y10T 428/1317; Y10T 428/131; Y10T 428/31663; Y10T 428/1352; Y10T 428/31612
See application file for complete search history.

(56) References Cited

U.S. PATENT DOCUMENTS

| | | |
|---|---|---|
| 5,972,436 A | 10/1999 | Walther |
| 6,117,243 A | 9/2000 | Walther |
| 6,200,658 B1 * | 3/2001 | Walther ................ C03C 17/245 138/146 |
| 6,383,642 B1 | 5/2002 | Le Bellac et al. |
| 6,599,594 B1 | 7/2003 | Walther et al. |

(Continued)

FOREIGN PATENT DOCUMENTS

| | | |
|---|---|---|
| DE | 19629877 C1 | 3/1997 |
| EP | 0 811 367 A2 | 12/1997 |
| EP | 0 821 079 A1 | 1/1998 |

(Continued)

OTHER PUBLICATIONS

Schott Vials datasheet published by Schott online at https://www.pharmaceutical-business-review.com/wp-content/uploads/2014/05/schott-brochure-schott-vials-english-20092017.pdf and dated Sep. 2017 (Year: 2017).*

(Continued)

*Primary Examiner* — James C Yager
(74) *Attorney, Agent, or Firm* — TAYLOR & EDELSTEIN

(57) ABSTRACT

A coated glass container includes: a glass surface; and a coating that coats at least part of the glass surface to form a coated glass surface. The coating includes at least one layer. The coated glass container fulfills the following parameter: leaching of [Na] ions after an alkaline treatment is 10 mg/l or less [Na] ions.

17 Claims, 3 Drawing Sheets

(56) References Cited

U.S. PATENT DOCUMENTS

2010/0075077 A1* 3/2010 Bicker .................. C23C 16/511
　　　　　　　　　　　　　　　　　　　　　　427/535

FOREIGN PATENT DOCUMENTS

| EP | 2 106 461 B1 | 4/2012 |
| WO | 03/015122 A1 | 2/2003 |
| WO | 2008/071458 A1 | 6/2008 |
| WO | 2017207940 A1 | 12/2017 |
| WO | 2018/157097 A1 | 8/2018 |

OTHER PUBLICATIONS

Extended European Search Report dated Sep. 22, 2022 for European Patent Application No. 22164442.0 (11 pages).

* cited by examiner

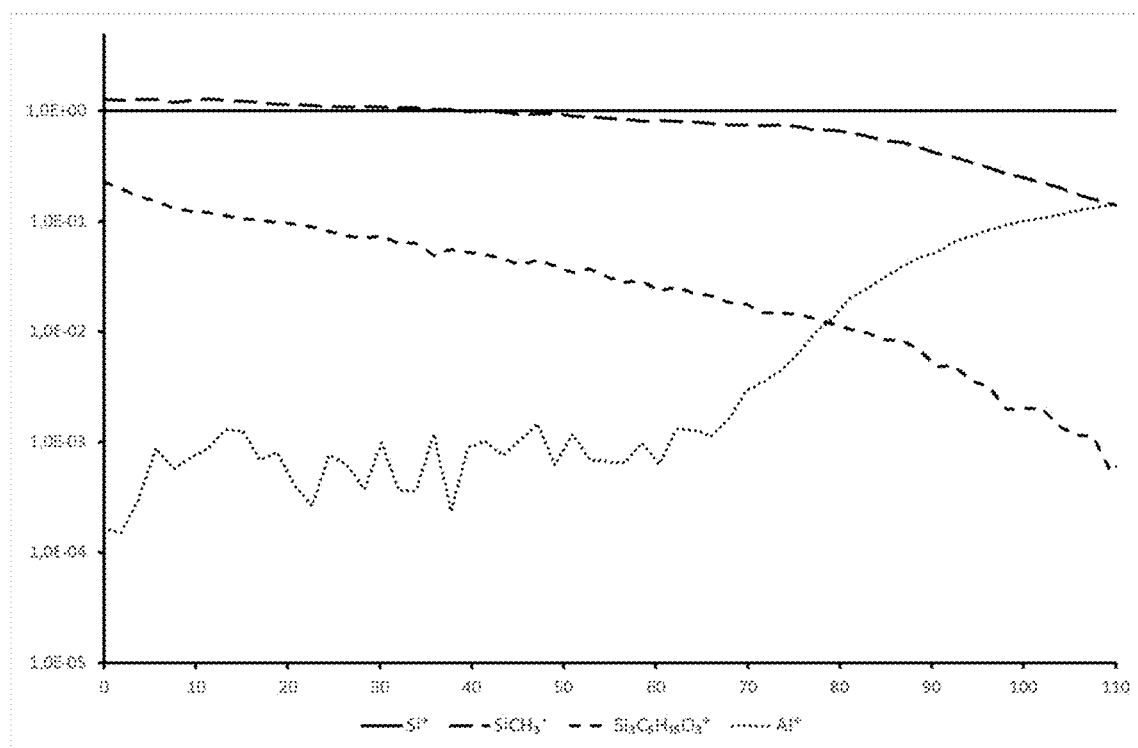
FIG. 5
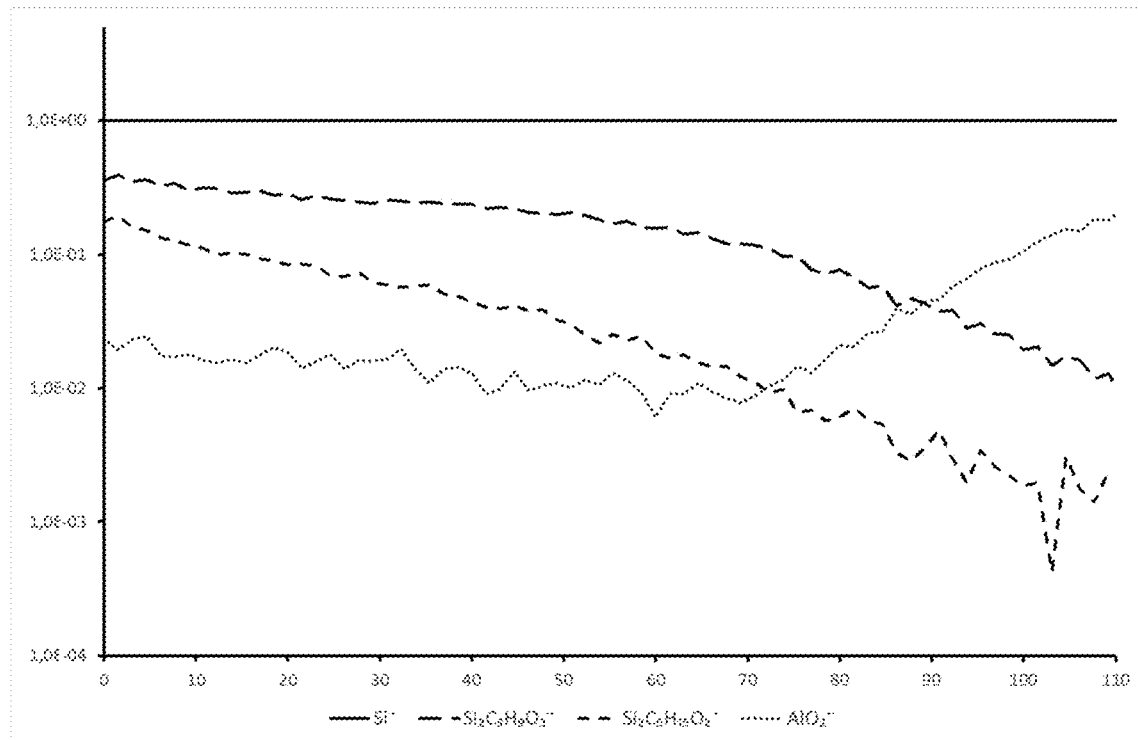

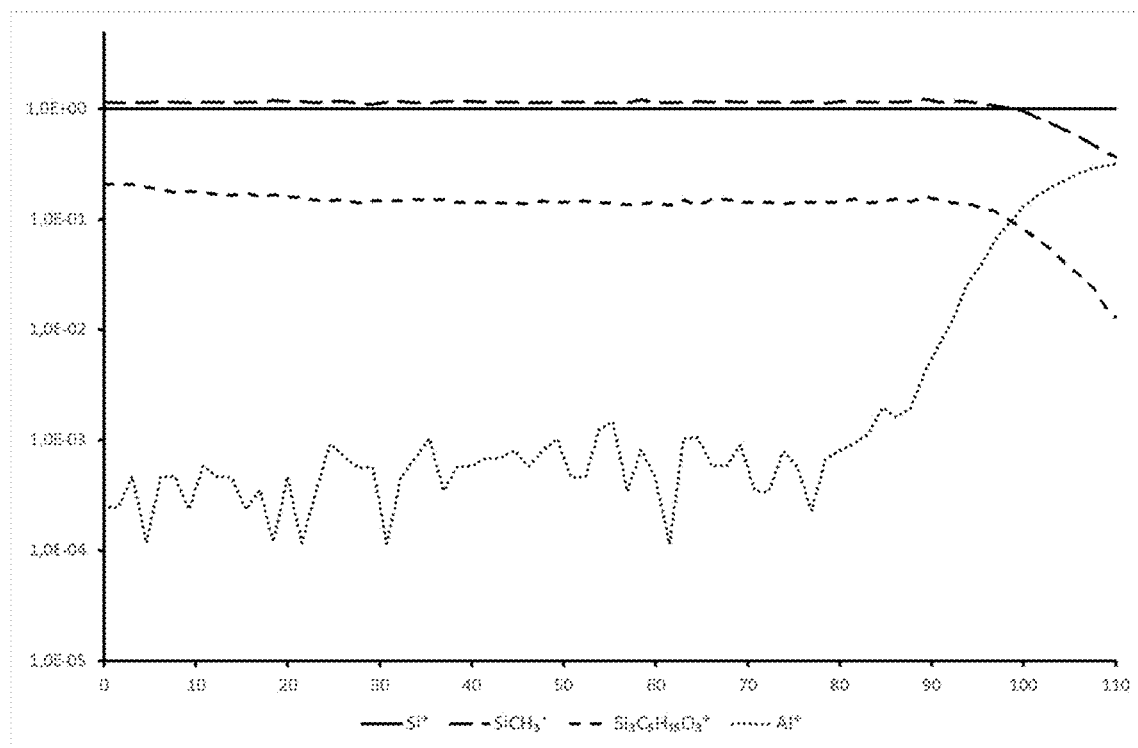
FIG. 7
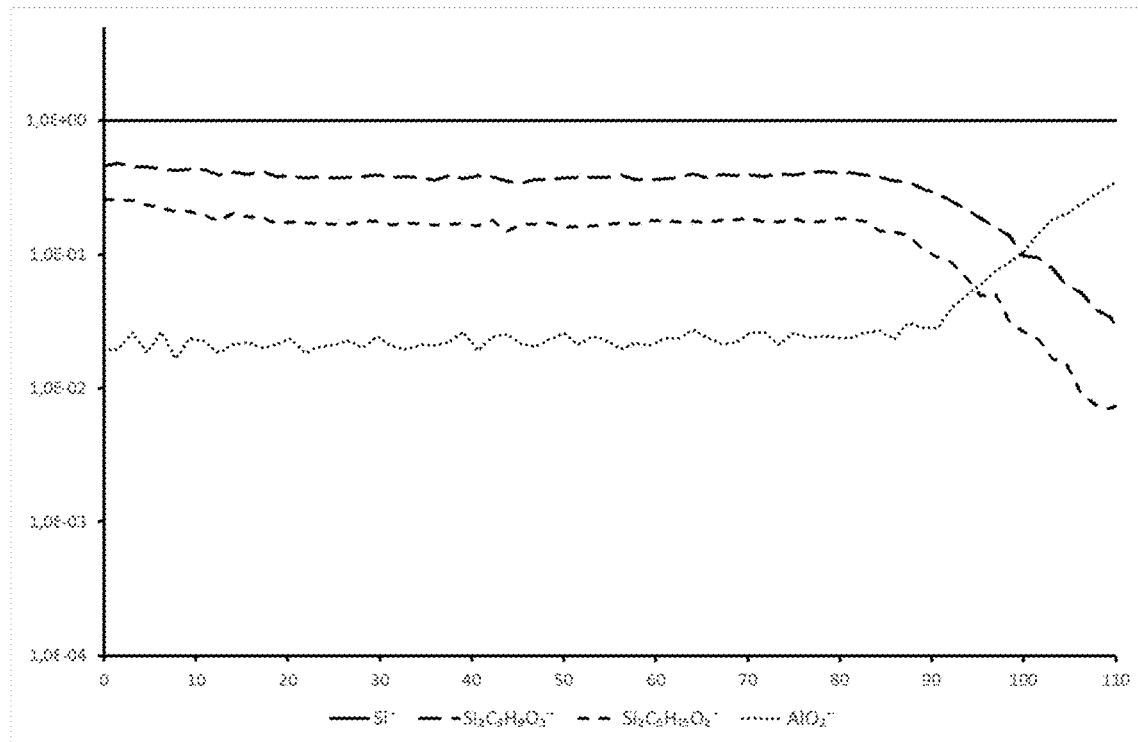

COATED GLASS ELEMENT

CROSS REFERENCE TO RELATED APPLICATIONS

This application claims priority to European Patent Application No. EP 21164787.0 filed on Mar. 25, 2021, which is incorporated in its entirety herein by reference.

BACKGROUND OF THE INVENTION

1. Field of the Invention

The present invention relates to coated glass elements and methods of producing coated glass elements.

2. Description of the Related Art

Pharmaceutical containers, such as vials or syringes, are commonly used to store pharmaceutical compositions. Moreover, pharmaceutical compositions to be administered by injection usually comprise a pharmaceutical substance dissolved in water. If the pharmaceutical container is used to store the composition for a long time, especially the interaction between the pharmaceutical composition and the container influences the storage capability of the pharmaceutical composition. Glass as a material for pharmaceutical containers is advantageous, since, for example, it has a very low permeability with regard to gases. To enhance the resistance of the glass surface, it is well known to apply a coating, e.g. EP 0 821 079 A1 and EP 0 811 367 A2.

However, the stability of the coating, particularly at high pH-values, is problematic, especially under severe conditions or if the pharmaceutical container is used to store very sensitive pharmaceutical substances, such as biologics, in an alkaline buffer solution.

What is needed in the art is a way to provide a coating having: excellent resistance in a wide pH range; and/or improved resistance at high pH values; and/or high chemical stability; and/or excellent adhesion properties; and/or excellent emptying properties.

SUMMARY OF THE INVENTION

In some exemplary embodiments provided according to the present invention, a coated glass container includes: a glass surface; and a coating that coats at least part of the glass surface to form a coated glass surface. The coating includes at least one layer. The coated glass container fulfills the following parameter: leaching of [Na] ions after an alkaline treatment is 10 mg/l or less [Na] ions.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 4 illustrates results of Example 1 of the herein described TOF-SIMS measurement (positive ions);

FIG. 5 illustrates results of Example 1 of the herein described TOF-SIMS measurement (negative ions);

FIG. 6 illustrates results of Example 3 of the herein described TOF-SIMS measurement (positive ions); and FIG. 7 illustrates results of Example 3 of the herein described TOF-SIMS measurement (negative ions).

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Method

Figure 1:
FIG. 1 is a schematic side view of an exemplary embodiment provided according to the invention.

According to the invention, the method for coating a glass element comprises:
provide a glass element comprising a glass surface;
performing a coating process on at least part of the glass surface, comprising:
a) surrounding the at least part of the glass surface of the glass element with a precursor P1; and
b) irradiating the precursor P1 to generate a plasma;
wherein at least one of the following parameters is/are fulfilled:
i) the process temperature PT1 is 200° C. or more; and/or
ii) the pulse duration PD1 of the irradiation is 50 µs or less.

In some embodiments, the coating process is a chemical vapor deposition process. In some embodiments, the coating process is a plasma-enhanced chemical vapor deposition (PECVD) process, plasma impulse chemical vapor deposition (PICVD) process or plasma assisted chemical vapor deposition (PACVD) process. Especially if the process is a plasma impulse chemical vapor deposition (PICVD) process, both the process temperature and the pulse duration of the microwave plasma can be controlled in an advantageous manner. The resistance and stability of the layer can be further improved, if the process is a plasma impulse chemical vapor deposition process and the process temperature and the pulse duration of the microwave plasma are within the ranges described herein.

The process temperature may be 200° C. or more. In some embodiments, the process temperature PT1 is 200° C. to Tg of the glass of the glass element, for example 200° C. to 500° C., 220° C. to 450° C., 240° C. to 320° C., or 250° C. to 300° C. If the temperature is 200° C. or more, for example 220° C. or more, the energy is sufficient to split the precursor and to form a homogenous layer. This improves the resistance and stability of the layer. However, if the temperature is too high, complete decomposition of the precursor might occur. Thus, if the temperature is 200° C. to 500° C., for example 250° C. to 300° C., the adhesion, resistance and stability of the layer can be further improved.

According to the invention, the pulse duration of the microwave plasma may be 50 µs or less. In some embodiments, the pulse duration PD1 of the plasma is 50 µs or less, 40 µs or less, 30 µs or less, 20 µs or less, 15 µs or less, 12 µs or less, 8 µs or less, y6 µs or less, 4 µs or less, or 3 µs; and/or the pulse duration PD1 of the plasma is 0.1 µs or more, for example 0.5 µs or more, 1 µs or more, or 6 µs or more. If the pulse duration is 50 µs or less, the precursor decomposes appropriately and the resistance and stability of the layer is further increased. Consequently, if the pulse duration is 2 to 15 μs, for example 3 to 8 μs, the layer composition with regard to resistance and stability performance can be further improved. The combination of the specific pulse duration PD1 and the specific temperature PT1 is also provided.

The way for providing the ignition of the plasma is not particularly limited. In some embodiments, the irradiation is carried out by a microwave generator, wherein the ray has a frequency of 300 MHz to 300 GHz, for example 600 MHz to 100 GHz, 800 MHz to 10 GHz, 900 MHz to 3 GHz, or about 2.45 GHz. Thus, the properties of the layer can be further improved.

The input power is not particularly limited. In some embodiments, the input power IP1 of the radiation generator, for example the input power IP1 of the microwave generator for the microwave irradiation, is 1,000 W to 10,000 W, such as 2,100 W to 8,000 W, 2,500 W to 6,700 W, 3,000 W to 6,000 W, 3,200 W to 5,500 W, or 4,000 W to 5,000 W. Thus, a homogenous layer is ensured and consequently, the layer composition with regards to resistance and stability performance can be further improved. The combination of the specific pulse duration PD1, the specific input power IP1 and the specific temperature PT1 is also provided.

The precursor P1 is not particularly limited. In some embodiments, the precursor P1 comprises one or more of hexamethyldisiloxane (HMDSO), hexamethyldisilazane (HMDS), tetramethylsilane (TMS), trimethylborazole (TMB), tri (dimethylaminosilyl)-amino-di (dimethylamino) borane (TDADB), tris(trimethylsilyl) borate (TMSB), hexamethylcyclotrisiloxane (HMCTSO), octamethylcyclotetrasiloxane (OMCTS), decamethylcyclopentasiloxane (DMCPS), dodecamethylcyclohexasiloxane (DMCHS), diacetoxy-di-t-butoxysilane (DADBS), tetraethoxysilane (TEOS), tris(trimethylsilyloxy) vinylsilane (TTMSVS), vinyltriethoxysilane (VTES) and/or combinations thereof; and/or the precursor P1 comprises, and in some embodiments consists of, the elements Si, C, O and H.

In some embodiments, the precursor P1 comprises siloxanes according to the formula $R_1R_2R_3$—Si—O—Si—$R_4R_5R_6$, wherein $R_1$, $R_2$, $R_3$, $R_4$, $R_5$ and $R_6$ can be independently selected from each other, wherein $R_1$, $R_2$, $R_3$, $R_4$, $R_5$ and $R_6$ can be selected from the group of methyl, ethyl, or propyl.

In some embodiments, the precursor P1 comprises linear siloxanes selected from the list of hexamethyldisiloxane (HIVIDSO), octamethyltrisiloxane, decamethyltetrasiloxane, dodecame-thylpentasiloxane, and tetradecamethylhexasiloxane.

In some embodiments, the precursor P1 comprises cyclic siloxanes selected from the list of hexamethylcyclotrisiloxane (HMCTSO), octamethylcyclotetrasiloxane (OMCTS), decamethyl-cyclopentasiloxane (DMCPS) and dodecamethylcyclohexasiloxane (DMCHS).

In some embodiments, surrounding the at least part of the glass surface of the glass element with a precursor P1 may be understood as exposing the at least part of the glass surface of the glass element to a precursor P1.

In some embodiments, surrounding the at least part of the glass surface of the glass element with a precursor P1 may be understood as subjecting the at least part of the glass surface of the glass element to a precursor P1.

The process pressure PR1 is not particularly limited. In some embodiments, the process pressure PR1 is 0.01 mbar to 500 mbar, for example 0.1 mbar to 10 mbar, 0.3 mbar to 5 mbar, 0.6 mbar to 2.0 mbar, or about 0.8 mbar. If the pressure is in the exemplary ranges, the layer composition with regards to resistance and stability performance can be further improved. Regulating the process pressure may advantageously allow to influence and/or steer the process temperature PT1. Without wishing to be bound by theory, at higher pressure more (plasma-generated) particles will collide effecting an increase in temperature. In some embodiments of the method provided according to the invention, the process pressure PR1 is 0.01 mbar or more, 0.1 mbar or more, 0.3 mbar or more, 0.6 mbar or more, or 0.8 mbar or more. In some embodiments, the process pressure PR1 is 500 mbar or less, 10 mbar or less, 5 mbar or less, or 2.0 mbar or less.

In some embodiments, the coating process is a PICVD process. In some embodiments, at least one, for example all, of the following parameters is/are fulfilled:

i) the process temperature PT1 is 200° C. to Tg of the glass of the glass element, for example 200° C. to 500° C., 220° C. to 450° C., 240° C. to 320° C., or 250° C. to 300° C.; and/or ii) the pulse duration PD1 of the plasma is 50 us or less, for example 40 us or less, 30 us or less, 20 us or less, 15 us or less, 12 us or less, 8 us or less, 6 us or less, 4 us or less, or 3 us; and/or iii) the pulse duration PD1 of the plasma is 0.1 us or more, for example 0.5 us or more, 1 us or more, or 6 us or more; and/or iv) the irradiation is carried out by a microwave generator, for example the ray has a frequency of 300 MHz to 300 GHz, 600 MHz to 100 GHz, 800 MHz to 10 GHz, 900 MHz to 3 GHz, or 2.45 GHz; and/or v) the input power IP1, such as the input power IP1 of the microwave generator, is 1,000 W to 10,000 W, for example 2,100 W to 8,000 W, 2,500 W to 6,700 W, 3,000 W to 6,000 W, 3,200 W to 5,500 W, or 4,000 W to 5,000 W; and/or vi) precursor P1 comprises one or more of hexamethyldisiloxane (HMDSO), hexamethyldisilazane (HMDS), tetramethylsilane (TMS), trimethylborazole (TMB), tri (dimethylaminosilyl)-amino-di (dimethylamino) borane (TDADB), tris(trimethylsilyl) borate (TMSB), hexamethylcyclotrisiloxane (HMCTSO), octamethylcyclotetrasiloxane (OMCTS), decamethylcyclopentasiloxane (DMCPS), dodecamethylcyclohexasiloxane (DMCHS) diacetoxy-di-t-butoxysilane (DADBS), tetraethoxysilane (TEOS), tris(trimethylsilyloxy) vinylsilane (TTMSVS), vinyltriethoxysilane (VTES) and/or combinations thereof; and/or vii) the precursor P1 comprises, for example consists of, the elements Si, C, O and H; and/or viii) the pulse pause PP1 between two pulses is 1 μs or more, for example 10 μs or more, 1 μs to 5 s, 0.1 ms to 10 ms, 0.2 ms to 2.0 ms, 0.3 ms to 1.2 ms, or 0.4 to 0.8 ms; and/or ix) the total time TT1 of irradiation is 0.1 s or more, for example 1 s or more, 1 s to 5 min, 3 s to 90 s, or 5 s to 40 s; and/or x) the ratio [us/ms] of all pulse durations PD1 [μs] to all pulse pauses PP1 [ms] is 1 or more, for example 2 or more, 2 to 50, or 3 to 8; and/or xi) the process pressure PR1 is 0.01 mbar to 500 mbar, for example 0.1 mbar to 10 mbar, 0.3 mbar to 5 mbar, 0.6 mbar to 2.0 mbar, or 0.8 mbar; and/or xii) the process temperature PT1 is decreasing, for example steadily decreasing, during the coating process; and/or xiii) the process temperature PT1 is at least partially, for example at the time when coating process starts, 220°

C. or more, such as 240° C. or more, 250° C. or more, 255° C. or more, 270° C. or more, or 280° C. or more; and/or xiv) the flow rate of the precursor P1 is 0.1 to 500 sccm, for example 5 to 100 sccm, 8 to 30 sccm, or 10 to 15 sccm.

Especially, if the above parameters xii) and xiii), for example i) to v), viii), and xi) to xiv) are fulfilled, it has been surprisingly recognized that the properties of the layer are further improved. If all the parameters i) to xiv) are fulfilled, the protection of the glass surface can be further improved. Optionally the coating process is a plasma impulse chemical vapor deposition (PICVD) process.

The coating process is advantageous because it provides a coated glass element with a layer which is both stable against acidic solutions and display a good alkaline resistance. The provided coatings may display long-term stability, e.g. three years or on the order of up to ten years, when exposed to acidic or alkaline solutions. The skilled artisan appreciates that biologics may be typically stored in mild acidic or mild alkaline solutions, e.g. having a pH of 3 or 8. The provided coatings may advantageously display reduced leaching of alkali ions, e.g. [Na] ions, and/or other ions, e.g. [Si], [B], [Al] and [Ca] ions, originating from components in the glass. The provided coatings may be advantageously very thin, for example having thicknesses between 20 and 100 nm, for example 40 nm.

In some embodiments, the method for coating a glass element comprises the steps: providing a glass element comprising a glass surface; performing a coating process on at least part of the glass surface, comprising the steps: a) surrounding the at least part of the glass surface of the glass element with a precursor P1, wherein the precursor P1 comprises the elements Si, C, O and H; and b) irradiating the precursor P1 to generate a plasma; wherein the following parameters are fulfilled: i) the process temperature PT1 is at least partially 220° C. or more, wherein the process temperature PT1 is decreasing during the coating process; and ii) optionally the pulse duration PD1 of the irradiation is 50 µs or less.

In some embodiments, the process temperature PT1 is decreasing during the coating process, which may be understood to occur within the total time TT1 of irradiation.

It may be advantageous if the process temperature PT1 is at least partially 200° C. or more, for example 220° C. or more, and decreases during the coating process. The coated glass elements may have an improved alkaline resistance which presumably correlates with a gradually changing layer on the glass surface. It is assumed that the process temperature PT1 decrease during the coating process results in a gradually changing layer on the glass surface, which is e.g. evidenced by the [$SiCH_3+$] counts, [$Si_3C_5H_{15}O_3+$] counts, and [$Si_2C_5H_{15}O_2-$] counts, measured by a TOF-SIMS, at 20% and 80% of the time a sputter gun beam needs to reach the glass surface.

In some embodiments, the process temperature PT1 is at least partially 220° C. or more, wherein the process temperature PT1 is decreasing during the coating process to a final process temperature fPT1 of at least partially 160° C. or more, at least partially 180° C. or more, at least partially 200° C. or more, or at least partially 210° C. or more, wherein the process temperature PT1 decrease occurs within the total time TT1 of irradiation.

In some embodiments, the process temperature PT1 is 160° C. to Tg of the glass of the glass element, for example 180° C. to Tg of the glass of the glass element, 200° C. to Tg of the glass of the glass element, 200° C. to 500° C., 220° C. to 450° C., 240° C. to 320° C., or 250° C. to 300° C. In some embodiments, the process temperature PT1 is 200° C. or more, 220° C. or more, 240° C. or more, or 250° C. or more. In some embodiments, the process temperature PT1 is Tg of the glass of the glass element or less, 500° C. or less, 450° C. or less, 320° C. or less, or 300° C. or less. Without wishing to be bound by theory, it is assumed that a higher process temperature PT1 provides for a coating which is more resembling the glass surface and/or has a thinner organic coating.

In some embodiments, the coating process is a plasma impulse chemical vapor deposition (PICVD) process, the pulse duration PD1 of the plasma is 0.1 µs or more, for example 0.5 µs or more, 1 µs or more, or 6 µs or more. In some embodiments, the pulse duration PD1 of the plasma is 100 µs or less, 50 µs or less, 20 µs or less, or 10 µs or less. In some embodiments, the pulse duration PD1 of the plasma is 0.1 to 100 µs, 0.5 to 50 µs, 1 to 20 µs, or 6 to 10 µs. The microwave-assisted PICVD process may be advantageous for the formation of the coating and may be beneficial for providing a more leaching and/or alkali resistant coating.

In some embodiments, the coating process is a PICVD process, the irradiation is carried out by a microwave generator, the ray has a frequency of 300 MHz to 300 GHz, 600 MHz to 100 GHz, 800 MHz to 10 GHz, 900 MHz to 3 GHz, or about 2.45 GHz. In some embodiments, the ray has a frequency of 300 MHz or more, 600 MHz or more, 800 MHz or more, 900 MHz or more, or 2.45 GHz. In some embodiments, the ray has a frequency of 300 GHz or less, 100 GHz or less, 10 GHz or less, or 3 GHz or less.

In some embodiments, the coating process is a PICVD process, the input power IP1, for example the input power IP1 of the microwave generator, is 1,000 W to 10,000 W, for example 2,100 W to 8,000 W, 2,500 W to 6,700 W, 3,000 W to 6,000 W, 3,200 W to 5,500 W, or 4,000 W to 5,000 W. In some embodiments, the input power IP1, for example of the microwave generator, is 1,000 W or more, 2,100 W or more, 2,500 W or more, 3,000 W or more, 3,200 W or more, or 4,000 W or more. In some embodiments, the input power IP1, for example of the microwave generator, is 10,000 W or less, 8,000 W or less, 6,700 W or less, 6,000 W or less, 5,500 W or less, or 5,000 W or less.

In some embodiments, the flow rate of the precursor P1 is 0.1 to 500 sccm, for example 5 to 100 sccm, 8 to 30 sccm, or 10 to 15 sccm. The precursor P1 may be chemically pure with a degree of at least 99 wt. %.

In some embodiments, the coating process is a PICVD process, wherein the following parameters are fulfilled:
ii) the pulse duration PD1 of the plasma is 50 µs or less, for example 40 µs or less, 30 µs or less, 20 µs or less, 15 µs or less, 12 µs or less, 8 µs or less, 6 µs or less, 4 µs or less, or 3 µs;
iii) the pulse duration PD1 of the plasma is 0.1 µs or more, for example 0.5 µs or more, 1 µs or more, or 6 µs or more; and
iv) the irradiation is carried out by a microwave generator, for example wherein the ray has a frequency of 300 MHz to 300 GHz, 600 MHz to 100 GHz, 800 MHz to 10 GHz, 900 MHz to 3 GHz, or about 2.45 GHz.

In some embodiments, the coating process is a PICVD process, wherein the following parameters are fulfilled:
ii) the pulse duration PD1 of the plasma is 50 µs or less, for example 40 µs or less, 30 µs or less, 20 µs or less, 15 µs or less, 12 µs or less, 8 µs or less, 6 µs or less, 4 µs or less, or 3 µs;

iii) the pulse duration PD1 of the plasma is 0.1 µs or more, for example 0.5 µs or more, 1 µs or more, or 6 µs or more;
iv) the irradiation is carried out by a microwave generator, for example wherein the ray has a frequency of 300 MHz to 300 GHz, 600 MHz to 100 GHz, 800 MHz to 10 GHz, 900 MHz to 3 GHz, or about 2.45 GHz;
v) the input power IP1, for example the input power IP1 of the microwave generator, is 1,000 W to 10,000 W, for example 2,100 W to 8,000 W, 2,500 W to 6,700 W, 3,000 W to 6,000 W, 3,200 W to 5,500 W, or 4,000 W to 5,000 W; and
viii) the pulse pause PP1 between two pulses is 1 µs or more, for example 10 µs or more, 1 µs to 5 s, 0.1 ms to 10 ms, 0.2 ms to 2.0 ms, 0.3 ms to 1.2 ms, or 0.4 to 0.8 ms.

Furthermore, it has been surprisingly found that the adhesion of the specific layer described herein can be improved, if a pretreatment process is performed before the coating process on the glass surface which should be coated. Thus, in some embodiments the method comprises the step:
performing a pretreating process on the at least part of the glass surface of the glass element, wherein the pretreating process is one or more, for example at least a plasma pretreatment, such as first a washing pretreatment and then a plasma pretreatment, of the following:
i) a washing pretreatment; and/or
ii) a plasma pretreatment; and/or
iii) a corona pretreatment.

The plasma treatment can also be used to temper the glass. In addition, if a plasma treatment is used, the same machine for the pretreatment and the coating step can be used which reduces costs and production time. Without wishing to be bound to theory, it has been surprisingly recognized that, by performing the specific pretreatment described herein, the glass surface is activated, e.g. the silanol groups on the surface of the glass, and by the herein-described specific coating process afterwards, a layer can be obtained having the herein described improved properties. Thus, especially the combination of the pretreatment, for example the specific plasma pretreatment described herein, and the specific coating process described herein may result in a layer having especially improved properties, i.e. excellent resistance in a wide pH range, improved resistance at high pH values, high chemical stability, excellent adhesion properties and excellent emptying properties.

In some embodiments, the washing pretreatment is spraying water to the at least part of the glass surface, wherein one or more, for example all, of the following parameters are fulfilled:
i) the time of spraying is 1 s to 5 h, for example 5 s to 60 min, 1 min to 40 min, or 10 min to 40 min; and/or
ii) the water conductivity is 0.1 µs/cm to 400 µs/cm, for example 0.5 µs/cm to 10 µs/cm, 1 µs/cm to 5 µs/cm, or about 2 µs/cm; and/or
iii) the temperature of the water is 10° C. or more, for example 15° C. to 100° C., 20° C. to 80° C., or 25° C. to 40° C.

In some embodiments, all parameters i) to iii) are fulfilled. In some embodiments, the spraying time is 10 min or more, and/or the water conductivity is 2 µs/cm or less and/or the water temperature is at least partially 30° C. or more. In some embodiments, the water is sprayed by a needle nozzle, for example having an inner diameter of 0.05 mm to 5 mm, for example 0.5 mm to 2 mm, to the at least part of the glass surface. The washing treatment is very easy to implement in production. In some embodiments, after the washing treatment, the glass surface is dried, for example for 1 to 100 minutes at 100 to 400° C., such as for 35 minutes to 40 minutes at 200 to 300° C. In some embodiments, the washing pretreatment is performed before the plasma pretreatment.

In some embodiments, the plasma pretreatment is a plasma-enhanced chemical vapor treatment (PECVT) process, plasma impulse chemical vapor treatment (PICVT) process or plasma assisted chemical vapor treatment (PACVT) process, comprising the steps:
a) surrounding the at least part of the glass surface of the glass element with a precursor P2, and
b) irradiating the precursor P2 to generate a plasma;
wherein at least one, for example all, of the following parameters is/are fulfilled:
i) the process temperature PT2 is room temperature to Tg of the glass of the glass element, for example room temperature to 450° C., room temperature to 400° C., room temperature to 320° C., room temperature to 280° C.; and/or
ii) pulse duration PD2 of the plasma is 50 ms or less, for example 40 ms or less, 30 ms or less, 20 ms or less, 15 ms or less, 8 ms or less, 6 ms or less, 1 ms or less, or 0.5 ms; and/or
iii) the pulse duration PD2 of the plasma is 0.1 ms or more, for example 0.2 ms or more, 0.3 ms or more, or 0.5 ms or more; and/or
iv) the irradiation is carried out by a microwave generator, for example the ray has a frequency of 300 MHz to 300 GHz, 600 MHz to 100 GHz, 800 MHz to 10 GHz, 900 MHz to 3 GHz, or about 2.45 GHz; and/or
v) the input power IP2, for example the input power IP2 of the microwave generator, is 1,000 W to 10,000 W, for example 2,500 W to 8,000 W, 4,000 W to 8,000 W, 5,000 W to 7000 W, 5,000 W to 6500 W, or 5250 W to 5750 W; and/or
vi) the precursor P2 comprises argon, oxygen and/or nitrogen, and/or the precursor P2 is air; and/or
vii) the precursor P2 comprises, for example consists of, the elements N, e.g. $N_2$, and/or O, e.g. $O_2$; and/or
viii) the pulse pause PP2 between two pulses is 1 µs or more, for example 10 µs or more, 1 µs to 5 s, 0.1 ms to 10 ms, 0.5 ms to 2.0 ms, 1.5 ms to 2.0 ms, or 1.8 ms; and/or
ix) the total time TT2 of irradiation is 0.1 s or more, for example 1 s or more, 1 s to 5 min, or 5 s to 15 s; and/or
x) the ratio [ms/ms] of all pulse durations PD2 [ms] to all pulse pauses PP2 [ms] is 0.05 or more, for example 0.1 or more, 0.15 to 5, or 0.2 to 0.5; and/or
xi) the process pressure PR2 is 0.01 mbar to 500 mbar, for example 0.1 mbar to 100 mbar, 0.5 mbar to 10 mbar, 0.8 mbar to 6.0 mbar, or 1.0 mbar to 4.0 mbar; and/or
xii) the process temperature PT2 is increasing, for example steadily increasing, during the plasma pretreatment; and/or
xiii) the process temperature PT2 is at least partially, for example at the time when the plasma pretreatment process ends, 220° C. or more, for example 240° C. or more, 250° C. or more, 255° C. or more, 270° C. or more, or 280° C. or more; and/or
xiv) the flow rate of the precursor P2 is 0.1 to 500 sccm, for example 5 to 100 sccm, 8 to 50 sccm, or 20 to 30 sccm.

It has been surprisingly recognized that if a low pressure, i.e. 10 mbar or less, for example 6.0 mbar or less, or 4 mbar or less in combination with a low input power, i.e. 8,000 W or less, for example 7000 W or less, 6500 W or less, or 5750

W or less, is used, the previously described properties can be further improved. Furthermore, if one or more, for example all, parameters are fulfilled, the activation of the surface can be further improved. Consequently, the properties, especially the adhesion of the layer, can be improved. In some embodiments, the precursor P2 is chemically pure with a degree of at least 99 wt. %, for example at least 99.995%.

In some embodiments, surrounding the at least part of the glass surface of the glass element with a precursor P2 may be understood as exposing or subjecting the at least part of the glass surface of the glass element with a precursor P2.

In some embodiments, the total time TT2 of irradiation is the sum of all durations of the pulses and the pulse pauses.

In some embodiments, the process temperature PT2 is increasing, for example steadily increasing, during the plasma pretreatment, with respect to the total time TT2 of irradiation, wherein the total time TT2 of irradiation is the sum of all durations of the pulses and the pulse pauses.

In some embodiments, the corona pretreatment comprises the steps:
  positioning the at least part of the glass surface of the glass element between a first and a second electrode; and
  surrounding the at least part of the glass surface of the glass element with a precursor P3; and
  applying a current C1 and/or voltage V1 between the first and the second electrode;
wherein at least one, for example all, of the following parameters is/are fulfilled:
  i) the first electrode is made of brass; and/or
  ii) the second electrode is made of aluminum; and/or
  iii) the precursor P3 is selected from, oxygen, nitrogen, air, and/or mixtures thereof; and/or
  iv) the process pressure PR3 is 100 mbar to 2000 mbar, for example 500 mbar to 1500 mbar, or 900 mbar to 1200 mbar; and/or
  v) the time of applying the current is 0.1 s to 30 s, for example 0.5 s to 5 s; and/or
  vi) the current C1 and/or voltage V1 is 1 kV to 10 kV, for example 2 kV to 5 kV; and/or
  vii) the frequency of the current C1 and/or voltage V1 is 1 to 50 kHz, for example 10 to 30 kHz or 12 to 18 kHz.

In some embodiments, all parameters i) to vii) are fulfilled.

In some embodiments, the pretreating process described herein is performed before the coating process described herein. In some embodiments, first the washing pretreatment described herein, second the plasma pretreatment described herein and third the coating process described herein is performed. In some embodiments, the time between the pretreating process(es), for example the plasma pretreatment process, and the coating process is 1 year or less, for example 6 month or less, 1 day or less, 1 hour or less, 1 minute or less, 30 seconds or less, 20 seconds or less, or 15 seconds or less; and/or 1 second or more, for example 3 seconds or more, 8 seconds or more, or 10 seconds or more. Thus, the stability, especially the adhesion, of the layer can be improved.

In some embodiments, the method comprises the step:
  performing a post-processing on the at least part of the glass surface of the glass element, wherein the post-processing comprises the step:
    surrounding the at least part of the glass surface of the glass element with a precursor P4 comprising argon, oxygen and/or nitrogen; and in some embodiments cooling the glass element, to room temperature, in the presence of the precursor P4.

In some embodiments, the post-processing is performed after the coating process. Thus, the properties of the layer can be further improved.

In some embodiments, surrounding the at least part of the glass surface of the glass element with a precursor P4 may be understood as exposing or subjecting the at least part of the glass surface of the glass element with a precursor P4.

Treated Glass Element

By the herein described pretreatment, for example the herein described PICVT pretreatment, the herein described washing and PICVT pretreatment, it is possible to obtain a pretreated glass element, for example obtainable by a method described herein, wherein at least part of the glass surface of the glass element fulfills one or more of the following parameters:
  i) the ratio of the polar part of the surface energy [mN/m] to the disperse part of the surface energy [mN/m] is 1.4 or less, for example 0.10 to 1.44, 0.50 to 1.40, or 1.00 to 1.35; and/or
  ii) the polar part of the surface energy is 39.50 mN/m or less, for example 20.00 mN/m to 39.50 mN/m, 36.00 to 38.50 mN/m, or 36.50 to 38.00 mN/m; and/or
  iii) the disperse part of the surface energy is 27.5 mN/m or more, for example 27.50 mN/m to 40.00 mN/m, 28.00 mN/m to 35.00 mN/m, or 29.00 mN/m to 32.50 mN/m.

The surface energy may be determined according to DIN EN ISO 19403-1:2020-04, in particular 19403-2 and 19403-5.

It has been surprisingly found that a coated glass element, for example a CVD, a PECVD, PICVD or PACVD, a PICVD coated glass element exhibits improved properties, especially a stronger adhesion of the layer, if the previously described pretreatment, for example first the specific washing pretreatment described herein and then the specific plasma pretreatment described herein, has been performed. In some embodiments described herein, the previously described pretreated glass element; for example wherein first the specific washing pretreatment described herein is performed and then the specific plasma pretreatment described herein is performed; is used for a CVD coating process, a PECVD, PICVD or PACVD process, a PICVD process. In some embodiments, the at least part of the glass surface of the pretreated glass element fulfills the parameters: i, ii, iii, i+ii, ii+iii, or i+ii+iii.

Thus, an exemplary embodiment provided according to the present invention is the use of a pretreated glass element described herein in a method comprising a coating process, for example wherein the coating process comprises a CVD process, a PECVD, PICVD or PACVD process, a PICVD process. It has been recognized that the properties of the specific layer described herein significantly increases, if the pretreatment is performed. Thus, an exemplary embodiment provided according to the present invention is a use of a pretreated glass element described herein in a method comprising a coating process described herein.

Coated Glass Element

An exemplary embodiment provided according to the invention is to provide a coated glass element comprising a glass surface, wherein the glass element is a container such as a pharmaceutical glass container, wherein at least part of the glass surface is coated by a coating, wherein the coating comprises at least one layer, wherein the coated glass container fulfills the following parameter: leaching of [Na] ions after an alkaline treatment is 10 mg/l or less [Na] ions.

If the glass element fulfills this parameter, the glass surface of the glass element is sufficiently protected by the layer and shows improved stability and improved barrier properties against alkaline and acidic conditions. Consequently, the glass element is suitable for the storage of pharmaceutical compositions being sensitive to high pH values, e.g. biologics. In some embodiments, the alkaline treatment is performed as described herein and the leaching of [Na] ions is determined as described herein.

In some embodiments, the coated glass surface fulfills the following parameter: leaching of [Na] ions after a heat treatment and alkaline treatment is 10 mg/l or less [Na] ions.

If this parameter is fulfilled, the protection of the glass surface of the container is further improved and the container is in particular suitable for the storage of pharmaceutical compositions being very sensitive to high pH values. In some embodiments, the heat and alkaline treatments are performed as described herein and the leaching of [Na] ions is determined as described herein.

In some embodiments, the leaching of [Na] ions after an alkaline treatment, for example a heat and alkaline treatment, is 9 mg/l or less [Na] ions, for example 7 mg/l or less [Na] ions, 5 mg/l or less [Na] ions, 4 mg/l or less [Na] ions, 3 mg/l or less [Na] ions, 2 mg/l or less [Na] ions, 1 mg/l or less [Na] ions, 0.7 mg/l or less [Na] ions, 0.3 mg/l or less [Na] ions, 0.2 mg/l or less [Na] ions, or 0.1 mg/l or less [Na] ions. Thus, the protection is further improved. Especially, if the leaching of [Na] ions is 0.1 mg/l or less [Na] ions, the glass element is in particular suitable for the storage of pharmaceutical compositions being very sensitive to high pH values.

In some embodiments, the leaching of [Na] ions after an alkaline treatment, for example a heat and alkaline treatment, is 0 mg/l or more [Na] ions, such as 0.001 mg/l or more [Na] ions, 0.01 mg/l or more [Na] ions, or 0.1 mg/l or more [Na] ions.

Some exemplary embodiments provided according to the invention provide a coated glass element, for example according to any of the preceding embodiments, comprising a glass surface, wherein the glass element is a container such as a pharmaceutical glass container,
   wherein at least part of the glass surface is coated by a coating,
   wherein the coating comprises at least one layer, wherein the leaching of [Na] ions after an alkaline treatment, for example a heat and alkaline treatment, is a;
   wherein a≤b*c;
   wherein, if 0.9×(brimful volume) of the container is ≤1 ml, b is 5.00 mg/l,
   wherein, if 0.9×(brimful volume) of the container is >1 ml and ≤2 ml, b is 4.50 mg/ml,
   wherein, if 0.9×(brimful volume) of the container is >2 ml and ≤3 ml, b is 4.10 mg/ml,
   wherein, if 0.9×(brimful volume) of the container is >3 ml and ≤5 ml, b is 3.20 mg/ml,
   wherein, if 0.9×(brimful volume) of the container is >5 ml and ≤10 ml, b is 2.50 mg/ml,
   wherein, if 0.9×(brimful volume) of the container is >10 ml and ≤20 ml, b is 2.00 mg/ml,
   wherein, if 0.9×(brimful volume) of the container is >20 ml and ≤50 ml, b is 1.50 mg/ml,
   wherein, if 0.9×(brimful volume) of the container is >50 ml and ≤100 ml, b is 1.20 mg/ml,
   wherein, if 0.9×(brimful volume) of the container is >100 ml and ≤200 ml, b is 1.00 mg/ml,
   wherein, if 0.9×(brimful volume) of the container is >200 ml and ≤500 ml, b is 0.75 mg/l; and
   wherein, if 0.9×(brimful volume) of the container is >500 ml, b is 0.50 mg/l; and
   wherein c is 1.00, 0.90, 0.80, 0.70, 0.60, 0.50, 0.40, 0.30, 0.20, 0.15, 0.10, 0.08, or 0.05.

Since the leaching is dependent on the size of the container (see ISO 4802-2:2016(E)), the above parameter may be advantageous, especially for very small and large containers. If the parameter is fulfilled, the resistance in a wide pH range, especially at high pH values is further improved. In some embodiments, a is 0 mg/l or more, for example 0.001 mg/l or more, 0.01 mg/l or more, 0.1 mg/l or more, or 0.2 mg/l or more.

Some exemplary embodiments provided according to the invention provide a coated glass element, which may be according to any of the preceding embodiments, comprising a glass surface, wherein the glass element is a container such as a pharmaceutical glass container, wherein at least part of the glass surface is coated by a coating, wherein the coating comprises at least one layer, wherein the coated glass container fulfills the following parameter: leaching of [Si], [B], [Al] and/or [Ca] ions [mg/l] after storage of 3 years at pH 8 is: 25 mg/l [Si] ions or less, for example 3.7 mg/l [Si] ions or less, or 1.0 to 3.0 mg/l [Si] ions; and/or
   1.0 mg/l [B] ions or less, for example 0.5 mg/l [B] ions or less, or 0.001 to 0.2 mg/l [B] ions; and/or
   1.0 mg/l [Al] ions or less, for example 0.5 mg/l [Al] ions or less, or 0.001 to 0.14 mg/l [Al] ions; and/or
   10 mg/l [Ca] ions or less, for example 5 mg/l [Ca] ions or less, or 1.0 to 4.9 mg/l [Ca] ions.

Some exemplary embodiments provided according to the invention provide a coated glass element, which may be according to any of the preceding embodiments, comprising a glass surface, wherein the glass element is a container such as a pharmaceutical glass container, wherein at least part of the glass surface is coated by a coating, wherein the coating comprises at least one layer, wherein the coated glass container fulfills the following parameter: leaching of [Si], [B], [Al] and/or [Ca] ions [mg/ml] after storage of 3 years at pH 5.5 is:
   1.30 mg/l [Si] ions or less, for example 1.10 mg/l [Si] ions or less, or 0.001 to 0.60 mg/l [Si] ions; and/or
   0.1 mg/l [B] ions or less, for example 0.05 mg/l [B] ions or less, or 0.001 to 0.004 mg/l [B] ions; and/or
   0.1 mg/l [Al] ions or less, for example 0.01 mg/l [Al] ions or less, or 0.001 to 0.0004 mg/l [Al] ions; and/or
   0.1 mg/l [Ca] ions or less, for example 0.05 mg/l [Ca] ions or less, or 0.001 to 0.004 mg/l [Ca] ions.

In some embodiments of the coated glass element being a container, for example a pharmaceutical glass container, leaching of [Si] ions [mg/ml] after storage of 3 years at pH 5.5 is 1.30 mg/l [Si] ions or less, 1.10 mg/l [Si] ions or less, or 0.001 to 0.60 mg/l [Si] ions.

In some embodiments of the coated glass element being a container, for example a pharmaceutical glass container, leaching of [B] ions [mg/ml] after storage of 3 years at pH 5.5 is 0.1 mg/l [B] ions or less, 0.05 mg/l [B] ions or less, or 0.001 to 0.004 mg/l [B] ions.

In some embodiments of the coated glass element being a container, for example a pharmaceutical glass container, leaching of [Al] ions [mg/ml] after storage of 3 years at pH 5.5 is 0.1 mg/l [Al] ions or less, 0.01 mg/l [Al] ions or less, or 0.001 to 0.0004 mg/l [Al] ions.

In some embodiments of the coated glass element being a container, for example a pharmaceutical glass container, leaching of [Ca] ions [mg/ml] after storage of 3 years at pH 5.5 is 0.1 mg/l [Ca] ions or less, 0.05 mg/l [Ca] ions or less, or 0.001 to 0.004 mg/l [Ca] ions.

In some embodiments of the coated glass element being a container, for example a pharmaceutical glass container, leaching of [Na] ions after a heat and alkaline treatment is 9 mg/l or less [Na] ions, and leaching of [Si] ions [mg/ml] after storage of 3 years at pH 8 is 25 mg/l [Si] ions or less, 3.7 mg/l [Si] ions or less, or 1.0 to 3.0 mg/l [Si] ions.

In some embodiments of the coated glass element being a container, for example a pharmaceutical glass container, leaching of [Na] ions after a heat and alkaline treatment is 9 mg/l or less [Na] ions, and leaching of [B] ions [mg/ml] after storage of 3 years at pH 8 is 1.0 mg/l [B] ions or less, 0.5 mg/l [B] ions or less, or 0.001 to 0.2 mg/l [B] ions.

In some embodiments of the coated glass element being a container, for example a pharmaceutical glass container, leaching of [Na] ions after a heat and alkaline treatment is 9 mg/l or less [Na] ions, and leaching of [Al] ions [mg/ml] after storage of 3 years at pH 8 is 1.0 mg/l [Al] ions or less, 0.5 mg/l [Al] ions or less, or 0.001 to 0.14 mg/l [Al] ions.

In some embodiments of the coated glass element being a container, for example a pharmaceutical glass container, leaching of [Na] ions after a heat and alkaline treatment is 9 mg/l or less [Na] ions, and leaching of [Ca] ions [mg/ml] after storage of 3 years at pH 8 is 10 mg/l [Ca] ions or less, 5 mg/l [Ca] ions or less, or 1.0 to 4.9 mg/l [Ca] ions.

In some embodiments, the value(s) of leaching of [Si], [B], [Al] and/or [Ca] ions [mg/l] after storage of 3 years at pH 8 and/or 5.5 is/are determined as described herein.

Some embodiments provided according to the invention provide a coated glass element, which may be according to any embodiment described herein, comprising a glass surface, wherein at least part of the glass surface is coated by a coating, wherein the coating comprises at least one layer, wherein the at least one layer of the coating fulfills the following parameter: $[Al^+]_{80}/[Al^+]_{20} \geq 1.8$;
- wherein $[Al^+]_{20}$ are the counts of $[Al^+]$ ions, measured by a TOF-SIMS, at 20% of the time a sputter gun needs to reach the glass surface; and
- wherein $[Al^+]_{80}$ are the counts of $[Al^+]$ ions, measured by a TOF-SIMS, at 80% of the time a sputter gun beam needs to reach the glass surface.

This specific ratio of $[Al^+]$ ions can be detected in the specific measuring method described herein, if a specific glass surface is treated and coated by a specific method, e.g. the method described herein. If this parameter is fulfilled, the binding of the layer to the glass surface is very strong and the adhesion is improved. In addition, the glass element exhibits improved resistance in a wide pH range, especially at high pH values, and improved chemical stability.

In some embodiments, the at least one layer of the coating fulfills the following parameter(s):
$[Al^+]_{80}/[Al^+]_{20} \geq x1_{[Al+]}$;
wherein $x1_{[Al+]}$ is 2.0, 3, 5, 7, 10, 15, 20, or 25; and/or
$[Al^+]_{80}/[Al^+]_{20} \leq x2_{[Al+]}$;
wherein $x2_{[Al+]}$ is 500, 200, 100, 50, 40, 35, 30, 29, or 28.

If this/these parameter(s) is/are fulfilled, the adhesion, resistance and chemical stability is further improved.

In some embodiments, the at least one layer of the coating fulfills the following parameter(s):

$$[Al+]_{90}/[Al+]_{2.0} \geq x1'_{[Al+]};$$

wherein $x1'_{[Al+]}$ is 1.8, 2.0, 3, 5, 7, 10, 15, 20, or 25; and/or $$[Al+]_{90}/[Al+]_{20} \leq x2'_{[Al+]};$$

wherein $x2'_{[Al+]}$ is 500, 200, 100, 50, 40, 35, 30, 29, or 28; wherein $[Al+]_{20}$ are the counts of [Al+] ions, measured by a TOF-SIMS, at 20% of the time a sputter gun needs to reach the glass surface; and wherein $[Al+]_{90}$ are the counts of [Al+] ions, measured by a TOF-SIMS, at 90% of the time a sputter gun beam needs to reach the glass surface.

In some embodiments, the at least one layer of the coating fulfills the following parameter: $[Al+]_{90}/[Al+]_{20} \geq x1'_{[Al+]}$; wherein $x1'_{[Al+]}$ is 1.8, 2.0, 3, 5, 7, 10, 15, 20, or 25.

In some embodiments, the at least one layer of the coating fulfills the following parameter: $[Al+]_{90}/[Al+]_{20} \leq x2'_{[Al+]}$; wherein $x2'_{[Al+]}$ is 500, 200, 100, 50, 40, 35, 30, 29, or 28.

In some embodiments, the invention relates to a coated glass element comprising a glass surface, wherein at least part of the glass surface is coated by a coating, wherein the coating comprises at least one layer, wherein the at least one layer of the coating fulfills the following parameter(s): $[Al+]_{80}/[Al+]_{20} \geq 1.8$, and/or $[Al+]90/[Al+]20 \geq 1.8$; wherein $[Al+]_{20}$ are the counts of [Al+] ions, measured by a TOF-SIMS, at 20% of the time a sputter gun needs to reach the glass surface; wherein $[Al+]_{80}$ are the counts of [Al+] ions, measured by a TOF-SIMS, at 80% of the time a sputter gun beam needs to reach the glass surface; and wherein $[Al+]_{90}$ are the counts of [Al+] ions, measured by a TOF-SIMS, at 90% of the time a sputter gun beam needs to reach the glass surface.

In some embodiments, the at least one layer of the coating fulfills the following parameter(s):

$$y1_{[Al+]} \leq [Al^+]_{80}/[Al^+]_{60} \leq y2_{[Al+]},$$

$$y1_{[Al+]} \leq [Al^+]_{60}/[Al^+]_{40} \leq y2_{[Al+]}, \text{ and/or}$$

$$y1_{[Al+]} \leq [Al^+]_{40}/[Al^+]_{20} \leq y2_{[Al+]},$$

wherein $y1_{[Al+]}$ is 1.01, 2, 3, 5, 10, 15, 20, or 25; and/or
wherein $y2_{[Al+]}$ is 500, 200, 100, 50, 40, 30, 20, 10, or 5; and
wherein $[Al^+]_{40}$ are the counts of $[Al^+]$ ions, measured by a TOF-SIMS, at 40% of the time a sputter gun beam needs to reach the glass surface; and
wherein $[Al^+]_{60}$ are the counts of $[Al^+]$ ions, measured by a TOF-SIMS, at 60% of the time a sputter gun beam needs to reach the glass surface.

If this/these parameter(s) is/are fulfilled, the counts of $[Al^+]$ ions continuously increase towards the glass surface throughout the whole layer. Thus, the adhesion, resistance and chemical stability is further improved.

In some embodiments, the at least one layer of the coating fulfills the following parameter(s):

$$[SiCH_3^+]_{20}/[SiCH_3^+]_{80} \geq x1_{[SiCH3+]};$$

wherein $x1_{[SiCH3+]}$ is 1.05, 1.1, 1.2, 1.4, 1.6, 1.7, or 1.8, and/or $$[SiCH_3^+]_{20}/[SiCH_3^+]_{80} \leq x2_{[SiCH3+]};$$

wherein $x2_{[SiCH3+]}$ is 100, 75, 50, 40, 30, 20, 10, 5, 2, or 1.8; and
wherein $[SiCH_3^+]_{20}$ are the counts of $[SiCH_3^+]$ ions, measured by a TOF-SIMS, at 20% of the time a sputter gun beam needs to reach the glass surface; and
wherein $[SiCH_3^+]_{80}$ are the counts of $[SiCH_3^+]$ ions, measured by a TOF-SIMS, at 80% of the time a sputter gun beam needs to reach the glass surface.

Thus, the adhesion, resistance and chemical stability is further improved. $[SiCH_3^+]$ ions can be detected in the specific measuring method described herein, if (a) specific precursor(s), for example HMDSO, in the CVD process, for example PICVD process, is/are used.

In some embodiments, the at least one layer of the coating fulfills the following parameter(s):

$$[SiCH_3+]_{20}/[SiCH_3+]_{90} \geq x1'_{[SiCH3+]};$$

wherein $x1'_{[SiCH3+]}$ is 1.05, 1.1, 1.2, 1.4, 1.6, 1.7, or 1.8, and/or $$[SiCH_3+]_{20}/[SiCH_3+]_{90} \leq x2'_{[SiCH3+]};$$

wherein $x2'_{[SiCH3+]}$ is 100, 75, 50, 40, 30, 20, 10, 5, or 2; and wherein $[SiCH_3+]_{20}$ are the counts of $[SiCH_3+]$ ions, measured by a TOF-SIMS, at 20% of the time a sputter gun beam needs to reach the glass surface; and wherein $[SiCH_3+]_{90}$ are the counts of $[SiCH_3+]$ ions, measured by a TOF-SIMS, at 90% of the time a sputter gun beam needs to reach the glass surface.

Thus, the adhesion, resistance and chemical stability is further improved. $[SiCH_3+]$ ions can be detected in the specific measuring method described herein, if (a) specific precursor(s), for example HMDSO, in the CVD process, for example PICVD process, is/are used.

In some embodiments, the at least one layer of the coating fulfills the following parameter(s):

$$y1_{[SiCH3+]} \leq [SiCH_3^+]_{20}/[SiCH_3^+]_{40} \leq y2_{[SiCH3+]},$$

$$y1_{[SiCH3+]} \leq [SiCH_3^+]_{40}/[SiCH_3^+]_{60} \leq y2_{[SiCH3+]}, \text{ and/or}$$

$$y1_{[SiCH3+]} \leq [SiCH_3^+]_{60}/[SiCH_3^+]_{80} \leq y2_{[SiCH3+]};$$

wherein $y1_{[SiCH3+]}$ is 1.0, 1.1, 1.2, 1.4, or 1.5; and/or wherein $y2_{[SiCH3+]}$ is 100, 75, 50, 40, 30, 20, 10, 5, 2, or 1.5; and wherein $[SiCH_3^+]_{20}$ are the counts of $[SiCH_3^+]$ ions, measured by a TOF-SIMS, at 20% of the time a sputter gun beam needs to reach the glass surface;

wherein $[SiCH_3^+]_{40}$ are the counts of $[SiCH_3^+]$ ions, measured by a TOF-SIMS, at 40% of the time a sputter gun beam needs to reach the glass surface;

wherein $[SiCH_3^+]_{60}$ are the counts of $[SiCH_3^+]$ ions, measured by a TOF-SIMS, at 60% of the time a sputter gun beam needs to reach the glass surface; and wherein $[SiCH_3^+]_{80}$ are the counts of $[SiCH_3^+]$ ions, measured by a TOF-SIMS, at 80% of the time a sputter gun beam needs to reach the glass surface.

If this/these parameter(s) is/are fulfilled, the counts of $[SiCH_3^+]$ ions continuously increase towards the glass surface throughout the whole layer. Thus, the adhesion, resistance and chemical stability is further improved.

In some embodiments, the at least one layer of the coating fulfills the following parameter(s):

$$[Si_3C_5H_{15}O_3^+]_{20}/[Si_3C_5H_{15}O_3^+]_{80} \geq x1_{[Si3C5H15O3+]};$$

wherein $x1_{[Si3C5H15O3+]}$ is 1.2, 2, 3, 5, or 8; and/or $$[Si_3C_5H_{15}O_3^+]_{20}/[Si_3C_5H_{15}O_3^+]_{80} \leq x2_{[Si3C5H15O3+]};$$

wherein $x2_{[Si3C5H15O3+]}$ is 100, 75, 50, 40, 30, 20, 15, 12, 10, or 9; and wherein $[Si_3C_5H_{15}O_3^+]_{20}$ are the counts of $[Si_3C_5H_{15}O_3^+]$ ions, measured by a TOF-SIMS, at 20% of the time a sputter gun beam needs to reach the glass surface; and/or wherein $[Si_3C_5H_{15}O_3^+]_{80}$ are the counts of $[Si_3C_5H_{15}O_3^+]$ ions, measured by a TOF-SIMS, at 80% of the time a sputter gun beam needs to reach the glass surface.

$[Si_3C_5H_{15}O_3^+]$ ions can be found in the specific TOF-SIMS measurement described herein, if (a) specific precursor(s), for example HMDSO, in the CVD treatment, for example PICVD process, is/are used.

In some embodiments, the at least one layer of the coating fulfills the following parameter(s):

$$[Si_3C_5H_{15}O_3+]_{20}/[Si_3C_5H_{15}O_3+]_{90} \geq x1'_{[Si3C5H15O3+]};$$

wherein $x1'_{[Si3C5H15O3+]}$ is 1.2, 2, 3, 5, or 8; and/or $$[Si_3C_5H_{15}O_3+]_{20}/[Si_3C_5H_{15}O_3+]_{90} \leq x2'_{[Si3C5H15O3+]};$$

wherein $x2'_{[Si3C5H15O3+]}$ is 100, 75, 50, 40, 30, 20, 15, 12, 10, or 9; and wherein $[Si_3C_5H_{15}O_3+]_{20}$ are the counts of $[Si_3C_5H_{15}O_{3+}]$ ions, measured by a TOF-SIMS, at 20% of the time a sputter gun beam needs to reach the glass surface; and/or wherein $[Si_3C_5H_{15}O_3+]_{90}$ are the counts of $[Si_3C_5H_{15}O_3+]$ ions, measured by a TOF-SIMS, at 90% of the time a sputter gun beam needs to reach the glass surface.

In some embodiments, the at least one layer of the coating fulfills the following parameter(s):

$$y1_{[Si3C5H15O3+]} \leq [Si_3C_5H_{15}O_3^+]_{20}/[Si_3C_5H_{15}O_3^+]_{40} \leq y2_{[Si3C5H15O3+]};$$

$$y1_{[Si3C5H15O3+]} \leq [Si_3C_5H_{15}O_3^+]_{40}/[Si_3C_5H_{15}O_3^+]_{60} \leq y2_{[Si3C5H15O3+]}; \text{ and/or}$$

$$y1_{[Si3C5H15O3+]} \leq [Si_3C_5H_{15}O_3^+]_{60}/[Si_3C_5H_{15}O_3^+]_{80} \leq y2_{[Si3C5H15O3+]};$$

wherein $y1_{[Si3C5H15O3+]}$ is 1.0, 1.1, 1.5, 2, or 2.0; and/or wherein $y2_{[Si3C5H15O3+]}$ is 100, 75, 50, 40, 30, 20, 10, 5, 2, or 1.5; and wherein $[Si_3C_5H_{15}O_3^+]_{20}$ are the counts of $[Si_3C_5H_{15}O_3^+]$ ions, measured by a TOF-SIMS, at 20% of the time a sputter gun beam needs to reach the glass surface;

wherein $[Si_3C_5H_{15}O_3^+]_{40}$ are the counts of $[Si_3C_5H_{15}O_3^+]$ ions, measured by a TOF-SIMS, at 40% of the time a sputter gun beam needs to reach the glass surface;

wherein $[Si_3C_5H_{15}O_3^+]_{60}$ are the counts of $[Si_3C_5H_{15}O_3^+]$ ions, measured by a TOF-SIMS, at 60% of the time a sputter gun beam needs to reach the glass surface; and wherein $[Si_3C_5H_{15}O_3^+]_{80}$ are the counts of $[Si_3C_5H_{15}O_3^+]$ ions, measured by a TOF-SIMS, at 80% of the time a sputter gun beam needs to reach the glass surface.

If this/these parameter(s) is/are fulfilled, the counts of $[Si_3C_5H_{15}O_3^+]$ ions continuously increase towards the glass surface throughout the whole layer. Thus, the adhesion, resistance and chemical stability is further improved.

Some exemplary embodiments provided according to the invention provide a coated glass element, comprising a glass surface, wherein the at least part of the glass surface is coated by a coating, wherein the coating comprises at least one layer, wherein the at least one layer of the coating fulfills the following parameter:

$$[Si_2C_5H_{15}O_2^+]_{20}/[Si_2C_5H_{15}O_2^+]_{80} \geq 1.0;$$

wherein $[Si_2C_5H_{15}O_2^+]_{20}$ are the counts of $[Si_2C_5H_{15}O_2^-]$ ions, measured by a TOF-SIMS, at 20% of the time a sputter gun beam needs to reach the glass surface; and wherein $[Si_2C_5H_{15}O_2^+]_{80}$ are the counts of $[Si_2C_5H_{15}O_2^+]_{80}$ ions, measured by a TOF-SIMS, at 80% of the time a sputter gun beam needs to reach the glass surface.

$[Si_2C_5H_{15}O_2^+]$ ions can be detected in the specific measuring method described herein, if (a) specific precursor(s), for example HMDSO, in the CVD process, for example PICVD process, is/are used. If this/these parameter(s) is/are fulfilled, the binding of the layer to the glass surface is very strong and the adhesion is improved. In addition, the glass element exhibits improved resistance in a wide pH range and especially at high pH values, and improved chemical stability.

In some embodiments, the at least one layer of the coating fulfills the following parameter(s):

$$[Si_2C_5H_{15}O_2^+]_{20}/[Si_2C_5H_{15}O_2^+]_{80} \geq x1_{[Si2C5H15O2-]};$$

wherein $x1_{[Si2C5H15O2-]}$ is 1.2, 1.5, 2, 3, 5, 8, or 12; and/or $$[Si_2C_5H_{15}O_2^+]_{20}/[Si_2C_5H_{15}O_2^+]_{80} \leq x2_{[Si2C5H15O2-]};$$

wherein $x2_{[Si2C5H15O2-]}$ is 100, 75, 50, 40, 30, 25, 20, 18, 15, or 14.

If this parameter is fulfilled, the adhesion, resistance and chemical stability is further improved.

In some embodiments, the at least one layer of the coating fulfills the following parameter(s):

$$z1_{[Si2C5H15O2-]} \leq [Si_2C_5H_{15}O_2^+]_{20}/[Si_2C_5H_{15}O_2^+]_{40} \leq z2_{[Si2C5H15O2-]};$$

$$z1_{[Si2C5H15O2-]} \leq [Si_2C_5H_{15}O_2^+]_{40}/[Si_2C_5H_{15}O_2^+]_{60} \leq z2_{[Si2C5H15O2-]}; \text{ and/or}$$

$$z1_{[Si2C5H15O2-]} \leq [Si_2C_5H_{15}O_2^+]_{60}/[Si_2C_5H_{15}O_2^+]_{80} \leq z2_{[Si2C5H15O2-]};$$

wherein $z1_{[Si2C5H15O2-]}$ is 1.0, 1.1, 1.4, 1.5, 1.6, 2.0, or 2.4; and/or wherein $z2_{[Si2C5H15O2-]}$ is 100, 75, 50, 40, 30, 20, 10, 5, 3, 2, or 1.5; and wherein $[Si_2C_5H_{15}O_2^-]_{40}$ are the counts of $[Si_2C_5H_{15}O_2^-]$ ions, measured by a TOF-SIMS, at 40% of the time a sputter gun beam needs to reach the glass surface; and wherein $[Si_2C_5H_{15}O_2^+]_{60}$ are the counts of $[Si_2C_5H_{15}O_2^-]$ ions, measured by a TOF-SIMS, at 60% of the time a sputter gun beam needs to reach the glass surface.

If this/these parameter is/are fulfilled, the counts of $[Si_2C_5H_{15}O_2^-]$ ions continuously increase towards the glass surface throughout the whole layer. Thus, the adhesion, resistance and chemical stability is further improved.

In some embodiments, the at least one layer of the coating fulfills the following parameter(s):

$$[Si_2C_3H_9O_3^-]_{20}/[Si_2C_3H_9O_3^-]_{80} \geq x1_{[Si2C3H9O3-]};$$

wherein $x1_{[Si2C3H9O3-]}$ is 1.1, 1.5, 2, or 3; and/or $$[Si_2C_3H_9O_3^-]_{20}/[Si_2C_3H_9O_3^+]_{80} \leq x2_{[Si2C3H9O3-]};$$

wherein $x2_{[Si2C3H9O3-]}$ is 100, 75, 50, 40, 30, 20, 10, 8, 6, 5, or 4; and wherein $[Si_2C_3H_9O_3^-]_{20}$ are the counts of $[Si_2C_3H_9O_3^-]$ ions, measured by a TOF-SIMS, at 20% of the time a sputter gun beam needs to reach the glass surface; and wherein $[Si_2C_3H_9O_3^-]_{80}$ are the counts of $[Si_2C_3H_9O_3^-]_{80}$ ions, measured by a TOF-SIMS, at 80% of the time a sputter gun beam needs to reach the glass surface.

Thus, the adhesion, resistance and chemical stability is further improved. $[Si_2C_3H_9O_3^-]$ ions can be detected in the specific measuring method described herein, if (a) specific precursor(s), for example HMDSO, in the CVD process, for example PICVD process, is/are used.

In some embodiments, the at least one layer of the coating fulfills the following parameter(s):

$$x1_{[Si2C3H9O3-]} \leq [Si_2C_3H_9O_3^-]_{20}/[Si_2C_3H_9O_3^-]_{40} \leq x2_{[Si2C3H9O3-]};$$

$$x1_{[Si2C3H9O3-]} \leq [Si_2C_3H_9O_3^-]_{40}/[Si_2C_3H_9O_3^-]_{60} \leq x2_{[Si2C3H9O3-]}; \text{ and/or}$$

$$x1_{[Si2C3H9O3-]} \leq [Si_2C_3H_9O_3^-]_{60}/[Si_2C_3H_9O_3^-]_{80} \leq x2_{[Si2C3H9O3-]}; \text{ and}$$

wherein $x1_{[Si2C3H9O3-]}$ is 1.05, 1.1, 1.5, 2, or 3; and/or wherein $x2_{[Si2C3H9O3-]}$ is 100, 75, 50, 40, 30, 20, 10, 5, 3, 2, or 1.5; and wherein $[Si_2C_3H_9O_3^-]_{20}$ are the counts of $[Si_2C_3H_9O_3^-]$ ions, measured by a TOF-SIMS, at 20% of the time a sputter gun beam needs to reach the glass surface;

wherein $[Si_2C_3H_9O_3^-]_{40}$ are the counts of $[Si_2C_3H_9O_3^-]$ ions, measured by a TOF-SIMS, at 40% of the time a sputter gun beam needs to reach the glass surface;

wherein $[Si_2C_3H_9O_3^-]_{60}$ are the counts of $[Si_2C_3H_9O_3^-]$ ions, measured by a TOF-SIMS, at 60% of the time a sputter gun beam needs to reach the glass surface;

wherein $[Si_2C_3H_9O_3^-]_{80}$ are the counts of $[Si_2C_3H_9O_3^-]_{80}$ ions, measured by a TOF-SIMS, at 80% of the time a sputter gun beam needs to reach the glass surface.

If this/these parameter(s) is/are fulfilled, the counts of $[Si_2C_3H_9O_3^-]$ ions continuously increase towards the glass surface throughout the whole layer. Thus, the adhesion, resistance and chemical stability is further improved.

In some embodiments, the at least one layer of the coating fulfills the following parameter(s):

$$[AlO_2^-]_{90}/[AlO_2^-]_{20} \geq x1_{[AlO2-]};$$

wherein $x1_{[AlO2-]}$ is 1.3, 1.5, 1.8, or 2.0; and/or $$[AlO_2^-]_{90}/[AlO_2^-]_{20} \leq x2_{[AlO2-]};$$

wherein $x2_{[AlO2-]}$ is 100, 75, 50, 40, 30, 20, 10, 5, 3, 2, or 1.5; and wherein $[AlO_2^-]_{20}$ are the counts of $[AlO_2^-]$ ions, measured by a TOF-SIMS, at 20% of the time a sputter gun beam needs to reach the glass surface; and wherein $[AlO_2^-]_{90}$ are the counts of $[AlO_2^-]_{90}$ ions, measured by a TOF-SIMS, at 90% of the time a sputter gun beam needs to reach the glass surface.

If this parameter is fulfilled, the adhesion, resistance and chemical stability is further improved. This ratio of $[AlO_2^-]$ ions can be detected in the specific measuring method described herein, if a specific glass surface is treated by a specific method, e.g. the method described herein.

The precursor and thus the composition of the coating is not particularly limited. In some embodiments, the at least one layer comprises the elements Si, O and C measured by XPS. Thus, the previously described properties can be improved. In some embodiments, the at least one layer comprises $SiO_xC_y$, measured by XPS, wherein x is from 0.3 to 3.0, for example 0.5 to 2.0, or 0.9 to 1.5, and/or wherein y is from 0 to 6.0, for example 0.5 to 4.0, or 2.5 to 3.5.

If this parameter is fulfilled, the above-described properties can be further improved.

The thickness of the layer is not particular limited. In some embodiments, the thickness of the layer is 1 nm to 1 mm, for example 10 nm to 0.5 mm or 20 nm to 100 nm. If the thickness of the layer is within this range, the properties, especially the protection of the glass surface, can be improved.

The method, how the layer is applied to the glass surface, is not particularly limited. In some embodiments, the at least one layer is obtainable by a CVD process, for example a PECVD, PICVD or PACVD process. Thus, the binding of the layer to the glass surface is very strong and the adhesion is improved.

In some embodiments, the at least one layer is obtainable by a method provided according to some embodiments described herein. The method described herein is very cost efficient.

In some embodiments, the at least one layer is in direct contact with the glass surface of the glass element and/or the glass surface of the pretreated glass element. Thus, the adhesion to the glass surface is improved. In some embodiments, the at least one layer is the outermost layer and/or the coating faces to the lumen of the glass element. Thus, the protection of the glass surface is improved since the layer is in direct contact with the pharmaceutical composition.

In some embodiments, the coating is a multilayer coating. Thus, the properties of the coating can be expanded. For example a gliding layer, which may comprise silicone, may be added on top of the at least one layer to improve the gliding properties of the coating.

Closed Coated Glass Element

Some embodiments provided according to the invention provide a closed coated glass element that comprises: the coated glass element according to any embodiment described herein, and a closure system, for example a stopper and/or a cap.

Some embodiments provided according to the invention provide a closed coated glass element comprising: the coated glass element according to any embodiment described herein, and a plunger and/or a plunger rod; and/or a closure system, for example a tip cap and/or a needle shield.

In some embodiments, the closed coated glass element passes the container closure integrity test according to DIN EN ISO 8871-5:2016; chapter 4.4 in combination with Annex D. Thus, a secure transport of the pharmaceutical composition can be secured.

According to some embodiments provided according to the invention, a filled coated glass element comprises: the coated glass element according to any embodiment described herein, and a composition, for example a pharmaceutical composition such as a composition containing biologics (such as peptides or proteins, including antibodies) or mRNA. In some embodiments, the composition is a liquid composition having a pH of 7 or higher, for example 8 to 14, 8 to 10. In some embodiments, the composition comprises one or more compounds explicitly mentioned in WO 2018/157097 A1, which is incorporated herein by reference.

The time a sputter gun needs to reach the glass surface is not particularly limited. The time is dependent inter alia through the thickness of the layer and the stability of the layer. In some embodiments, the time a sputter gun needs to reach the glass surface is 0.5 to 60 minutes, for example 1 to 10 minutes or 2 to 4 minutes; and/or in the case positive ions are measured, the point, when the sputter gun reaches the glass surface is the point, when the ratio of the counts of $[Al^+]$ ions to the counts of $[Si^+]$ ions is equal to or exceeds a value of 0.10 for the first time; and/or in the case negative ions were measured, the point, when the sputter gun reaches the glass surface is the point, when the ratio of the counts of $[AlO_2^-]$ ions to the counts of $[Si^-]$ ions is equal to or exceeds a value of 0.10 for the first time; and/or the counts of the ions, for example the ions $[AlO_2^-]$, $[Si_2C_3H_9O_3^-]$, $[Si_2C_5H_{15}O_2^-]$, $[Si_3C_5H_{15}O_3^+]$, $[Al^+]$, and/or $[SiCH_3^+]$, are obtainable by the specific method described herein. If the time is within the previously mentioned range, the properties, especially the protection of the glass surface, can be improved.

The glass of the glass element is not particularly limited. In some embodiments, the glass is a borosilicate glass, an aluminosilicate glass, or a lithium-aluminosilicate (LAS) glass. Thus, a strong adhesion of the at least one layer can be improved.

In some embodiments, the composition of the glass comprises, in mass-%:
$SiO_2$: 30 to 98%, for example 50 to 90% or 70.0 to 74.0%; and/or
$B_2O_3$: 0 to 30%, for example 3 to 20% or 7.0 to 16.0%; and/or
$Al_2O_3$: 0 to 30%, for example 1 to 15% or 3.0 to 6.5%; and/or
$X_2O$: 0 to 30%, for example 1 to 15% or 2.0 to 7.2%, wherein X is selected from Na, K, and/or Li; and/or
YO: 0 to 30%, for example 0.1 to 5% or 0.5 to 1.0%, wherein Y is selected from Ca, Mg, and/or Ba.

In some embodiments, the composition of the glass consists of, in mass-%:
$SiO_2$: 30 to 98%, for example 50 to 90% or 70.0 to 74.0%;
$B_2O_3$: 0 to 30%, for example 3 to 20% or 7.0 to 16.0%;
$Al_2O_3$: 0 to 30%, for example 1 to 15% or 3.0 to 6.5%;
$X_2O$: 0 to 30%, for example 1 to 15% or 2.0 to 7.2%, wherein X is selected from Na, K, and/or Li;
YO: 0 to 30%, for example 0.1 to 5% or 0.5 to 1.0%, wherein Y is selected from Ca, Mg, and/or Ba; and in some embodiments, unavoidable impurities.

In some embodiments, the composition of the glass comprises, in mass-%:
$SiO_2$: 20 to 98%, for example 40 to 75% or 50 to 65%; and/or
$B_2O_3$: 0 to 30%, for example 1 to 15% or 3 to 9%; and/or
$Al_2O_3$: 0 to 30%, for example 10 to 20% or 13 to 18; and/or
$X_2O$: 0 to 30%, for example 0 to 5% or 0 to 3%, wherein X is selected from Na, K, and/or Li; and/or
YO: 0 to 50%, for example 0.1 to 40% or 10 to 35, wherein Y is selected from Ca, Mg, and/or Ba.

In some embodiments, the composition of the glass consists of, in mass-%:
$SiO_2$: 20 to 98%, for example 40 to 75% or 50 to 65%;
$B_2O_3$: 0 to 30%, for example 1 to 15% or 3 to 9%;
$Al_2O_3$: 0 to 30%, for example 10 to 20% or 13 to 18;
$X_2O$: 0 to 30%, for example 0 to 5% or 0 to 3%, wherein X is selected from Na, K, and/or Li;
YO: 0 to 50%, for example 0.1 to 40% or 10 to 35, wherein Y is selected from Ca, Mg, and/or Ba; and, in some embodiments, unavoidable impurities.

The shape of the glass element is not particularly limited. The shape might be a tube, rod, plate and/or container. In some embodiments, the glass element is a container, a pharmaceutical container, a vial, syringe, ampoule or cartridge. Even if developed for pharmaceutical packaging, the coated glass element might be used due to its improved properties also in cars, planes, technical tubes and many other technical fields.

If the glass element is a container, the volume of the container is not particularly limited. In some embodiments, the brimful volume of the container is 0.1 ml to 1,000 ml, for example, 0.5 ml to 500 ml, 1 ml to 250 ml, 2 ml to 30 ml, 2 ml to 15 ml, about 1 ml, 2 ml, 3 ml, 4, ml, 5 ml, 6 ml, 7 ml, 8 ml, 9 ml, 10 ml, 11 ml, 12 ml, 13 ml, 14 ml or 15 ml, or 5 to 15 ml.

The position of the at least part of the glass surface is not particularly limited. In some embodiments, the glass element, which may be a tube or container, comprises an inner surface, wherein the inner surface comprises, for example is, the at least part of the glass surface. Thus, if a pharmaceutical composition is present in the container, the inner surface of the glass element is efficiently protected.

In some embodiments, the glass element, which may be a tube or container, comprises an outer surface and the outer surface comprises, for example is, the at least part of the glass surface.

In some embodiments, the glass element is a vial or a cartridge comprising a cylindrical portion, a neck and a crown, wherein at least the inner surface of the cylindrical portion is coated by the coating. Thus, if a pharmaceutical composition is present in the container, the inner surface of the glass element is efficiently protected.

In some embodiments, the at least part of the glass surface of the container comprises at least part of the inner surface of the container, for example the at least part of the glass surface of the container is the surface which is in contact with a liquid when the container evenly stands on the ground and is filled with a liquid having a volume of 10% or more, for example 30% or more, or 90% or more with respect to the brimful volume [vol./vol.] of the container.

In some embodiments, the glass element is a vial or a cartridge comprising a cylindrical portion, a neck and a crown, wherein the crown, and the neck, are uncoated and/or the glass element is a syringe comprising a flange, a cylindrical portion and a tip, and a needle, wherein the needle, and the flange, and the tip, are uncoated. Thus, the storage stability of a pharmaceutical composition, if present, is improved.

Definitions

If not stated otherwise, throughout the description and the claims the following definitions apply:

Herein a layer is a layer which is obtainable by a coating process, for example the method comprising the coating process described herein. Within the one coating process, the precursor and the parameters of the process, e.g. the pulse duration in the PICVD process, do not change. Thus, for example, a single layer herein can be produced by a PICVD process using one precursor and one continuous coating step.

Herein a coating process is a process wherein at least one layer is applied on the glass surface. In some embodiments, the layer is applied by a CVD coating process, a PECVD, PICVD or PACVD process. In some embodiments, by one coating process, one layer can be obtained. Herein a pre-treatment is not a coating process. In some embodiments, all parameters described herein refer to the same layer within the coating.

Unavoidable impurities herein are impurities, which may be contained in the educts, e.g. Fe, Ti, Zn, Cu, Mn, Co. In some embodiments, the total amount of all unavoidable impurities is 5 wt.-% or less, for example 2.5 wt.-% or less, 1.0 wt.-% or less, 0.5 wt.-% or less, 0.1 wt.-% or less, or 0.01 wt.-% or less.

Herein the total time of irradiation is the sum of all durations of the pulses and the pulse pauses. Herein ambient temperature and pressure are 20° C. and 1.0 bar.

If not stated otherwise, herein $[R]_{tt}$ are the counts of $[R]$ ions, measured by a TOF-SIMS, at tt % of the time a sputter gun needs to reach the glass surface. For example all $[R]_{tt}$ values are determined as described herein.

The temperature during the processes herein refers to the temperature measured in the middle of the glass element with a pyrometer. In case the glass element is a container, the temperature is measured at the middle of the cylindrical part of the container, e.g. of the vial.

If not stated otherwise, the input power is the forward power measured between the irradiation generator, e.g. the microwave generator and the glass element, measured for example by a MW-Diode (ACTP-1502; damping 10 dB).

Parameters and Methods

Transition Temperature Tg

Herein, the transition temperature Tg can be, for example is, measured by differential scanning calorimetry (DSC).

Surface Energy

The surface energy was determined according to DIN EN ISO 19403-1:2020-04, in particular 19403-2 and 19403-5. As reference liquids water, diiodomethane and/or n-hexadecane were used.

Heat Treatment

Herein a heat treatment is tempering a glass element at 330° C. for 60 min in a pre-heated oven at ambient pressure. For the alkaline treatment either a heat treated glass element can be used or a glass element which has not been heat treated. If not stated otherwise, a glass element is a not heat treated glass element.

Alkaline Treatment

Herein the Alkaline Treatment is the Following:

A glass container, either heat treated or not heat treated, is provided. In case the container exhibits two openings, e.g. a syringe, the smaller opening is covered with a closure, e.g. a tip cap. Then 0.9×(brimful volume) of a 0.005 mol/l KOH-solution (KOH:Potassium hydroxide hydrate ≥99.995%, Suprapur® (Merck), demineralized water (ultrapure water of purity 1 analogue DIN ISO 3696 with ≤0.1 µS/cm at 25° C.)) is filled in the container, closed with a stopper, and then the container is inserted in an autoclave (e.g. Systec, model DX-150 (PM-CA-0001-01)) and treated for 3 hours at 121° C. and 1 bar above ambient pressure, e.g. 2 bar. Thereafter, the container is emptied and washed two times with deionized water.

Leaching of [Na] Ions:

Herein, the value for the leaching of [Na] ions [mg/ml] can be obtained as follows:

After the alkaline treatment, for example after the heat and alkaline treatment, as described above, 0.9×(brimful volume) mL of 0.1 mol/l HCl-solution (hydrochloric acid 30% Suprapur® (Merck)) diluted with demineralized water (ultrapure water of purity 1 analogue DIN ISO 3696 with ≤0.1 µS/cm at 25° C.)), i.e. the same volume as used in the alkaline treatment is filled in the container and the container is closed with a stopper. Then the container is again inserted in an autoclave (e.g. Systec, model DX-150 (PM-CA-0001-01)) and treated for 6 hours at 121° C. and 1 bar above ambient pressure. Thereafter the [Na] ion concentration in the 0.1 mol/l HCl-solution is determined by FAAS analysis using e.g. Varian SpectrAA 280 FS (PE 3-004) to obtain the value [mg/ml] for the leaching of [Na] ions.

Leaching of [Si], [B], [Al] and [Ca] ions [mg/ml] after storage of 3 years at pH 8

Herein, the value for the leaching of [Si], [B], [Al] and [Ca] ions [mg/ml] after storage of 3 years at pH 8 can be obtained as follows:

A glass container, either heat treated or not heat treated, is provided. In case the container exhibits two openings, e.g. a syringe, the smaller opening is covered with a closure, e.g. a tip cap. Then 0.2×(brimful volume) of a sodium bicarbonate solution having pH 8 (336.04 g $NaHCO_3$ diluted with 4 liter demineralized water (ultrapure water of purity 1 analogue DIN ISO 3696 with ≤0.1 µS/cm at 25° C.) is filled in the container and the container is closed with a stopper. Then the container is stored in an oven at 25° C. for 3 years. Thereafter, [B], [Ca], [Si] ion and [Al] ion concentration in the bicarbonate solution is determined by ICP-MS (Agilent 7500ce) to obtain the value for the leaching of [B], [Ca], [Si] ion and [Al] ions [mg/ml] in the bicarbonate solution.

Leaching of [Si], [B], [Al] and [Ca] ions [mg/ml] after storage of 3 years at pH 5.5

A glass container, either heat treated or not heat treated, is provided. In case the container exhibits two openings, e.g. a syringe, the smaller opening is covered with a closure, e.g. a tip cap. Then 0.2×(brimful volume) of ultrapure water of purity 1 analogue DIN ISO 3696 with ≤0.1 µS/cm at 25° C. having a pH=5.5 is filled in the container and the container is closed with a stopper. Then the container is stored in an oven at 25° C. for 3 years. Thereafter, the [B], [Ca], [Si] and [Al] ion concentration in the water solution is determined by ICP-MS (Agilent 7500ce) to obtain the value for the leaching of [B], [Ca], [Si] and [Al$^+$] ions [mg/ml] in the water solution.

TOF-SIMS (Time-of-Flight Secondary Ion Mass Spectrometry)

In the following the measuring method and the data evaluation of the specific TOF-SIMS measurement is explained in detail. The values for the ions, e.g. the ions $[Al^+]_{20}$, $[Al^+]_{80}$, $[Si_2C_5H_{15}O_2^+]_{20}$ and $[Si_2C_5H_{15}O_2^-]_{80}$, can be obtained according to the following description.

Measuring Method

For the measurement a TOF SIMS (TOF. SIMS 5 from Iontof) can be used. If not stated otherwise, the TOF-SIMS are measured according to ASTM E 1829 and ASTM E 2695.

The following parameter settings were used for the TOF-SIMS:

For the Analysis:
  primary ion: $Bi^{3+}$;
  energy: 3,0000 eV;
  measuring area: 200×200 µm$^2$;
  pattern: 128×128 random; and
  bismuth analysis current: 0.3 pA.
For the sputter gun (Argon Cluster source):
  sputter ion: Ar1051 (Argon);
  energy: 5,000 eV;
  sputter area: 500×500 µm$^2$; and
  sputter current of Ar-cluster source: 1 nA.
Furthermore:
  cycle time: 200 µs
  analyzer extractor: 2160V;
  analyzer detector: 9000V;
  charge compensation: flood gun;
  primary ion flight time correction: on; and
  gas Flooding: $9×10^{-7}$ mbar.

A sample of a coated glass element, for example one half of an on the inside coated container, which was cut lengthwise in two pieces, is positioned in such a way that the centerline of the sputter gun and the centerline of the liquid metal ion gun of TOF-SIMS hit the coated area of the sample so that the sputter area covers the entire measuring area, preferably that the centerline of the sputter gun and the centerline of the liquid metal ion gun of TOF-SIMS hit the same point of the coated area of the sample. The TOF-SIMS measures either positive ions or negative ions. To obtain both kinds of ions, two measurements can be conducted using for each measurement a new area of the same sample or a new sample, e.g. the first and the second half of a coated container, which is cut lengthwise in two pieces.

Data Evaluation

For the data evaluation all counts of ions are normalized to the [Si$^+$] ions and [Si$^-$] ions, respectively, whereby the [Si$^+$] ions and [Si$^-$] ions, respectively, are set to 1 (see for example Table 1 and FIG. 4).

Additionally the point (sputter time), when the TOF SIMS analysis starts, is set to 0% and the point, when the glass surface is reached, is set to 100%. This is indicated by the [Al$^+$] signal and the [AlO2$^-$] signal, respectively, as those signals can be clearly assigned to the glass.

In the case positive ions are measured, the point, when the sputter gun reaches the glass surface, may be, for example is, the point, when the ratio of the counts of [Al$^+$] ions to the counts of [Si$^+$] ions is equal to or exceeds a value of 0.10 for the first time.

In the case negative ions are measured, the point, when the sputter gun reaches the glass surface, may be, for example is, the point, when the ratio of the counts of [AlO$_2^-$] ions to the counts of [Si$^-$] ions is equal to or exceeds a value of 0.10 for the first time.

For example, as can be seen in FIG. 4 and Table 1, the point, when the analysis, i.e. the measuring process, was started, was set to 0% of the time the sputter analysis process needed to reach the glass surface. At this point the ratio of the counts of [Al$^+$] ions to the counts of [Si$^+$] ions may be, for example is, 0.00. After a certain analysis time (sputter time), the value of the ratio of the counts of [Al$^+$] ions to the counts of [Si$^+$] ions is 0.10 or more. This point indicates the time a sputter gun beam needs to reach the glass surface as aluminum is clearly assigned as glass element. Till this point, the ratio was never 0.10 or higher (see FIG. 4). Consequently, this point was set to 100%, since this is 100% of the time the sputter analysis process needed to reach the glass surface.

EXAMPLE 1

Inventive Example

If not stated otherwise, example 1 was prepared according to EP 0 821 079 A1, EP 0 811 367 A2, WO 03 015 122 A1 and EP 2 106 461 A1:

Two 10 R vials (EVERIC™ pure from SCHOTT AG) were provided. As first pretreatment, a washing pretreatment was performed in which the vials were washed with ultrapure water with ≤10 µS/cm at 25° C. for two minutes at room temperature, for 6 minutes at 40° C., and subsequently for 25 minutes at room temperature in a laboratory dishwasher (LS-2000 from HAMO AG). Afterwards, the vials were dried for 20 minutes at 300° C.

Subsequently, the two vials were treated and coated simultaneously using an apparatus according to WO 03 015 122 A1. For all plasma treatments, a microwave irradiation was used having a frequency of 2.45 GHz. The reaction chambers were the insides of the vials. Ambient conditions prevailed outside of the vials.

First, the inside of the vials were evacuated until a value of 0.05 mbar was reached. Afterwards, oxygen was filled in the vials (flow rate for both vials: 50 sccm) until a pressure of 5 mbar was reached and then a plasma pretreatment started. The plasma was excited with an input power of 6,700 W (for both vials) in a pulsed mode with a pulse duration of 0.5 ms, and pulse pause of 1.8 ms. The plasma pretreatment was performed for 14 seconds until the temperature of the vials was 280° C., measured with a pyrometer at the middle of the cylindrical part of the vials.

Immediately afterwards the coating process was performed. The vials were filled with HMDSO (flow rate for both vials: 25 sccm) and the pressure was set to 0.8 mbar. Then, the vials were irradiated for 0.2 s (pressure: 0.8 mbar, flow rate for both vials: 25 sccm HMDSO, input power: 6,000 W, pulse duration: 0.050 ms, pulse pause: 30 ms) and subsequently irradiated for 50 s (pressure: 0.8 mbar, flow rate for both vials: 25 sccm HMDSO, input power: 3250 W, pulse duration: 0.003 ms, pulse pause: 1 ms).

Afterwards, a post-processing was performed, i.e. filling the vials with argon and cooling the vials to room temperature in the presence of argon to obtain two equally coated vials.

EXAMPLE 2

Inventive Example

If not stated otherwise, example 2 was prepared according to EP 0 821 079 A1, EP 0 811 367 A2, WO 03 015 122 A1 and EP 2 106 461 A1:

Two 10 R vials (EVERIC™ pure from SCHOTT AG) were provided. As first pretreatment, a washing pretreatment was performed in which the vials were washed with ultrapure water with ≤10 µS/cm at 25° C. for two minutes at room temperature, for 6 minutes at 40° C., and subsequently for 25 minutes at room temperature in a laboratory dishwasher (LS-2000 from HAMO AG). Afterwards, the vials were dried for 20 minutes at 300° C.

Subsequently, the two vials were treated and coated simultaneously using an apparatus according to WO 03 015 122 A1. For all plasma treatments, a microwave irradiation was used having a frequency of 2.45 GHz. The reaction chambers were the insides of the vials. Ambient conditions prevailed outside of the vials.

First, the inside of the vials were evacuated until a value of 0.05 mbar was reached. Afterwards, oxygen was filled in the vials (flow rate for both vials: 50 sccm) until a pressure of 1.2 mbar was reached and then a plasma pretreatment started. The plasma was excited with an input power of 5,500 W in a pulsed mode with a pulse duration of 0.5 ms, and pulse pause of 1.8 ms. The plasma pretreatment was performed for 27 seconds until the temperature of the vials was 280° C., measured with a pyrometer at the middle of the cylindrical part of the vials.

Immediately afterwards (11 seconds) the coating process was performed. The vials were filled with HMDSO (flow rate for both vials: 25 sccm) and the pressure was set to 0.8 mbar. Then, the vials were irradiated for 0.2 s (pressure: 0.8 mbar, flow rate for both vials: 25 sccm HMDSO, input power: 6,000 W, pulse duration: 0.050 ms, pulse pause: 30 ms) and subsequently irradiated for 11 s (pressure: 0.8 mbar, flow rate for both vials: 25 sccm HMDSO, input power: 4500 W, pulse duration: 0.008 ms, pulse pause: 0.5 ms). After the coating process, the temperature of the vials was 280° C., measured with a pyrometer at the middle of the cylindrical part of the vials.

Afterwards, a post-processing was performed, i.e. filling the vials with oxygen and cooling the vials to room temperature in the presence of oxygen to obtain two equally coated vials.

EXAMPLE 3

Reference Example

Example 3 is a SCHOTT TopLyo® 10R glass vial.
TOF-SIMS Measurements

The results of Example 1 of the herein described TOF-SIMS measurement are summarized in Tables 1 and 2 and depicted in FIGS. 4 and 5. The results of Example 3 of the herein described TOF-SIMS measurement are summarized in Tables 3 and 4 and depicted in FIGS. 6 and 7.

TABLE 1

Example 1: positive ions

| sputter time [sec] | $Al^+$ [counts] | $Si^+$ [counts] | $SiCH_3^+$ [counts] | $Si_3C_5H_{15}O_3^+$ [counts] | $Al^+/Si^+$ | t [%] |
|---|---|---|---|---|---|---|
| 0 | 1.64E−04 | 1.00E+00 | 1.26E+00 | 2.29E−01 | 0.00 | 0 |
| 16 | 7.94E−04 | 1.00E+00 | 1.26E+00 | 1.22E−01 | 0.00 | 10 |
| 31 | 6.03E−04 | 1.00E+00 | 1.15E+00 | 9.70E−02 | 0.00 | 20 |
| 47 | 9.87E−04 | 1.00E+00 | 1.08E+00 | 7.40E−02 | 0.00 | 30 |
| 62 | 9.03E−04 | 1.00E+00 | 9.81E−01 | 5.29E−02 | 0.00 | 40 |
| 78 | 9.03E−04 | 1.00E+00 | 9.14E−01 | 3.69E−02 | 0.00 | 50 |
| 94 | 6.26E−04 | 1.00E+00 | 8.19E−01 | 2.33E−02 | 0.00 | 60 |
| 109 | 2.87E−03 | 1.00E+00 | 7.43E−01 | 1.77E−02 | 0.00 | 70 |
| 125 | 1.68E−02 | 1.00E+00 | 6.50E−01 | 1.11E−02 | 0.02 | 80 |
| 139 | 5.04E−02 | 1.00E+00 | 4.39E−01 | 5.82E−03 | 0.05 | 90 |
| 155 | 1.02E−01 | 1.00E+00 | 2.50E−01 | 2.00E−03 | 0.10 | 100 |
| 172 | 1.43E−01 | 1.00E+00 | 1.38E−01 | 6.34E−04 | 0.14 | 110 |

TABLE 2

Example 1: negative ions

| sputter time [sec] | $Si^-$ [counts] | $AlO_2^-$ [counts] | $Si_2C_3H_9O_3^-$ [counts] | $Si_2C_5H_{15}O_2^-$ [counts] | $AlO_2^-/Si^-$ | t [%] |
|---|---|---|---|---|---|---|
| 0 | 1.00E+00 | 2.36E−02 | 3.57E−01 | 1.77E−01 | 0.02 | 0 |
| 19 | 1.00E+00 | 1.72E−02 | 3.07E−01 | 1.15E−01 | 0.02 | 10 |
| 38 | 1.00E+00 | 1.88E−02 | 2.86E−01 | 8.42E−02 | 0.02 | 20 |
| 57 | 1.00E+00 | 1.63E−02 | 2.50E−01 | 6.08E−02 | 0.02 | 30 |
| 76 | 1.00E+00 | 1.29E−02 | 2.38E−01 | 4.44E−02 | 0.01 | 40 |
| 95 | 1.00E+00 | 1.06E−02 | 2.02E−01 | 3.13E−02 | 0.01 | 50 |
| 114 | 1.00E+00 | 6.10E−03 | 1.57E−01 | 1.82E−02 | 0.01 | 60 |
| 133 | 1.00E+00 | 8.32E−03 | 1.19E−01 | 1.17E−02 | 0.01 | 70 |
| 153 | 1.00E+00 | 2.11E−02 | 7.72E−02 | 6.18E−03 | 0.02 | 80 |

TABLE 2-continued

Example 1: negative ions

| sputter time [sec] | Si⁻ [counts] | AlO$_2$⁻ [counts] | Si$_2$C$_3$H$_9$O$_3$⁻ [counts] | Si$_2$C$_5$H$_{15}$O$_2$⁻ [counts] | AlO$_2$⁻/Si⁻ | t [%] |
|---|---|---|---|---|---|---|
| 172 | 1.00E+00 | 4.54E−02 | 4.04E−02 | 4.25E−03 | 0.05 | 90 |
| 191 | 1.00E+00 | 1.06E−01 | 1.96E−02 | 1.88E−03 | 0.11 | 100 |
| 210 | 1.00E+00 | 2.00E−01 | 1.07E−02 | 1.20E−03 | 0.20 | 110 |

TABLE 3

Example 3: positive ions

| sputter time [sec] | Al⁺ [counts] | Si⁺ [counts] | SiCH$_3$⁺ [counts] | Si$_3$C$_5$H$_{15}$O$_3$⁺ [counts] | Al⁺/Si⁺ | t [%] |
|---|---|---|---|---|---|---|
| 0 | 2.52E−04 | 1.00E+00 | 1.15E+00 | 2.07E−01 | 0.00 | 0 |
| 19 | 4.07E−04 | 1.00E+00 | 1.15E+00 | 1.79E−01 | 0.00 | 10 |
| 38 | 4.66E−04 | 1.00E+00 | 1.17E+00 | 1.62E−01 | 0.00 | 20 |
| 57 | 3.43E−04 | 1.00E+00 | 1.13E+00 | 1.48E−01 | 0.00 | 30 |
| 76 | 5.77E−04 | 1.00E+00 | 1.17E+00 | 1.43E−01 | 0.00 | 40 |
| 95 | 7.49E−04 | 1.00E+00 | 1.15E+00 | 1.45E−01 | 0.00 | 50 |
| 114 | 4.52E−04 | 1.00E+00 | 1.13E+00 | 1.43E−01 | 0.00 | 60 |
| 133 | 6.28E−04 | 1.00E+00 | 1.15E+00 | 1.43E−01 | 0.00 | 70 |
| 153 | 8.08E−04 | 1.00E+00 | 1.16E+00 | 1.42E−01 | 0.00 | 80 |
| 172 | 5.78E−03 | 1.00E+00 | 1.18E+00 | 1.56E−01 | 0.01 | 90 |
| 191 | 1.33E−01 | 1.00E+00 | 9.51E−01 | 8.37E−02 | 0.13 | 100 |
| 210 | 3.20E−01 | 1.00E+00 | 3.70E−01 | 1.30E−02 | 0.32 | 110 |

TABLE 4

Example 3: negative ions

| sputter time [sec] | Si⁻ [counts] | AlO$_2$⁻ [counts] | Si$_2$C$_3$H$_9$O$_3$⁻ [counts] | Si$_2$C$_5$H$_{15}$O$_2$⁻ [counts] | AlO$_2$⁻/Si⁻ | t [%] |
|---|---|---|---|---|---|---|
| 0 | 1.00E+00 | 1.92E−02 | 4.59E−01 | 2.57E−01 | 0.02 | 0 |
| 19 | 1.00E+00 | 2.31E−02 | 4.33E−01 | 2.02E−01 | 0.02 | 10 |
| 38 | 1.00E+00 | 2.37E−02 | 3.89E−01 | 1.74E−01 | 0.02 | 20 |
| 56 | 1.00E+00 | 2.45E−02 | 3.92E−01 | 1.78E−01 | 0.02 | 30 |
| 75 | 1.00E+00 | 2.29E−02 | 3.77E−01 | 1.67E−01 | 0.02 | 40 |
| 94 | 1.00E+00 | 2.57E−02 | 3.72E−01 | 1.60E−01 | 0.03 | 50 |
| 113 | 1.00E+00 | 2.24E−02 | 3.66E−01 | 1.80E−01 | 0.02 | 60 |
| 132 | 1.00E+00 | 2.62E−02 | 3.94E−01 | 1.86E−01 | 0.03 | 70 |
| 150 | 1.00E+00 | 2.38E−02 | 4.07E−01 | 1.87E−01 | 0.02 | 80 |
| 169 | 1.00E+00 | 2.84E−02 | 2.98E−01 | 1.02E−01 | 0.03 | 90 |
| 188 | 1.00E+00 | 1.05E−01 | 9.85E−02 | 2.67E−02 | 0.11 | 100 |
| 207 | 1.00E+00 | 3.52E−01 | 2.94E−02 | 7.52E−03 | 0.35 | 110 |

Leaching of [Na] Ions

The results of Examples 1 to 3 of the herein described leaching of [Na] ions are summarized in Table 5:

TABLE 5

Leaching of [Na] ions

| Example | Treatment | [Na] [mg/l] |
|---|---|---|
| 1 | alkaline | 0.2 |
| 1 | heat and alkaline | 0.5 |
| 2 | alkaline | 0.1 |
| 3 | alkaline | 1.4 |

Leaching of [Si], [B], [Al] and [Ca] ions after storage of 3 years at pH 8 and pH 5.5

The results of Examples 1 and 3 of the herein described leaching of [Si], [B], [Al] and [Ca] ions [mg/ml] after storage of 3 years at pH 8 are summarized in Table 6:

TABLE 6

Leaching of [Si], [B], [Al] and [Ca] ions [mg/l] after storage of 3 years at pH 8

| Example | | 1 | 3 |
|---|---|---|---|
| [Si] | mg/l | 1.9 | 26.7 |
| [B] | mg/l | <0.1 | 0.3 |
| [Al] | mg/l | 0.1 | <0.1 |
| [Ca] | mg/l | 4.7 | 4.9 |

The results of Examples 1 and 3 of the herein described leaching of [Si], [B], [Al] and [Ca] ions [mg/ml] after storage of 3 years at pH 5.5 are summarized in Table 7:

TABLE 7

| Leaching of [Si], [B], [Al] and [Ca] ions [mg/l] after storage of 3 years at pH 5.5 | | | |
|---|---|---|---|
| Example | | 1 | 3 |
| [Si] | mg/l | 0.57 | 1.4 |
| [B] | mg/l | <0.005 | <0.005 |
| [Al] | mg/l | <0.001 | <0.001 |
| [Ca] | mg/l | <0.005 | <0.005 |

In the following description of embodiments, the same reference numeral designates similar components.

Figure 2:
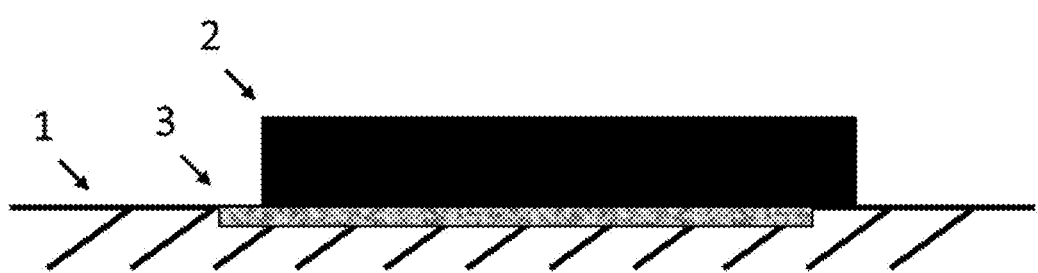
FIG. 2 is a schematic side view of an exemplary embodiment provided the invention.

Referring now to the drawings, FIGS. 1 and 2 depict schematic side views of an exemplary embodiment provided according to the invention. In FIG. 1, the glass surface 1 is partially coated by the coating 2. The depicted coating is a single layer coating. Consequently, the coating is in direct contact with the glass surface 1 and is the outermost layer. In FIG. 2, the partially pretreated glass surface 3 is partially coated by the coating 2. The depicted coating is a single layer coating. Consequently, the coating is in direct contact with the glass surface 1 and is the outermost layer.

Figure 3:
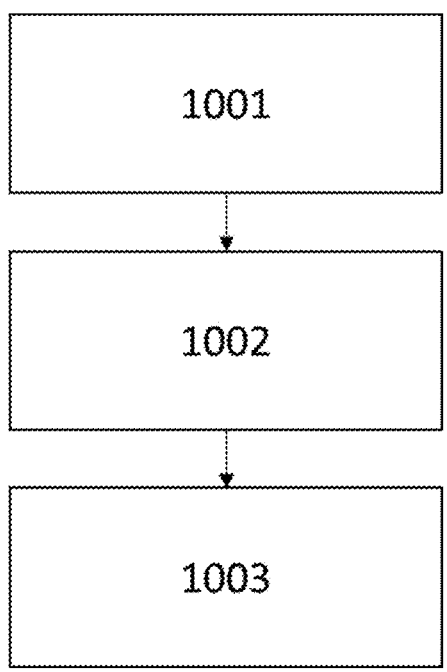
FIG. 3 illustrates a block diagram of an exemplary embodiment of a method provided according to the invention.

FIG. 3 shows a block diagram of a method provided according to the invention. After the pretreatment 1001, the coating process 1002 is performed. Afterwards a post-processing 1003 may be performed.

FIGS. 4 to 7 show the results of the TOF-SIMS measurement. Some of the values depicted in these figures can be found in Tables 1 to 4. As can be seen, the values for the inventive example (Example 1 in FIGS. 3 and 4) significantly change during sputtering, whereas in the reference example (Example 3) the values are constant most of the sputter time and then rapidly change after 90% of the time the sputter gun beam needs to reach the glass surface.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

Items

In summary, exemplary embodiments are the following. The scope of protection is defined by the claims. The combination of two or more embodiments, e.g. 3, 4 or 8 embodiments is further provided. Definitions and general statements herein may also apply for the following exemplary embodiments.

1. Method for coating a glass element comprising the steps:
   providing a glass element comprising a glass surface;
   performing a coating process on at least part of the glass surface, comprising the steps:
   a) surrounding the at least part of the glass surface of the glass element with a precursor P1; and
   b) irradiating the precursor P1 to generate a plasma;
   wherein at least one, for example both, of the following parameters is/are fulfilled:
   i) the process temperature PT1 is 200° C. or more; and/or
   ii) the pulse duration PD1 of the irradiation is 50 µs or less.

2. Method according to the preceding item, wherein the coating process is a plasma-enhanced chemical vapor deposition (PECVD) process, plasma impulse chemical vapor deposition (PICVD) process or plasma assisted chemical vapor deposition (PACVD) process.

3. Method according to any one of the preceding items, wherein the process temperature PT1 is 200° C. to Tg of the glass of the glass element, for example 200° C. to 500° C., 220° C. to 450° C., 240° C. to 320° C., or 250° C. to 300° C.

4. Method according to any one of the preceding items, wherein the pulse duration PD1 of the plasma is 50 µs or less, for example 40 µs or less, 30 µs or less, 20 µs or less, 15 µs or less, 12 µs or less, 8 µs or less, 6 µs or less, 4 µs or less, or 3 µs; and/or the pulse duration PD1 of the plasma is 0.1 µs or more, for example 0.5 µs or more, 1 µs or more, or 6 µs or more.

5. Method according to any one of the preceding items, wherein the irradiation is carried out by a microwave generator, wherein the ray has a frequency of 300 MHz to 300 GHz, 600 MHz to 100 GHz, 800 MHz to 10 GHz, 900 MHz to 3 GHz, or 2.45 GHz.

6. Method according to any one of the preceding items, wherein the input power IP1 of the radiation generator, for example the input power IP1 of the microwave generator for the microwave irradiation, is 1,000 W to 10,000 W, for example 2,100 W to 8,000 W, 2,500 W to 6,700 W, 3,000 W to 6,000 W, 3,200 W to 5,500 W, or 4,000 W to 5,000 W.

7. Method according to any one of the preceding items, wherein precursor P1 comprises one or more of hexamethyldisiloxane (HMDSO), hexamethyldisilazane (HMDS), tetramethylsilane (TMS), trimethylborazole (TMB), tri (dimethylaminosilyl)-amino-di (dimethylamino) borane (TDADB), tris(trimethylsilyl) borate (TMSB), hexamethylcyclotrisiloxane (HMCTSO), octamethylcyclotetrasiloxane (OMCTS), decamethylcyclopentasiloxane (DMCPS), dodecamethylcyclohexasiloxane (DMCHS) diacetoxy-di-t-butoxysilane (DADBS), tetraethoxysilane (TEOS), tris(trimethylsilyloxy) vinylsilane (TTMSVS), vinyltriethoxysilane (VTES) and/or combinations thereof; and/or wherein the precursor P1 comprises, for example consists of, the elements Si, C, O and H.

8. Method according to any one of the preceding items, wherein the process pressure PR1 is 0.01 mbar to 500 mbar, for example 0.1 mbar to 10 mbar, 0.3 mbar to 5 mbar, 0.6 mbar to 2.0 mbar, or 0.8 mbar.

9. Method according to any one of the preceding items, wherein the coating process is a plasma impulse chemical vapor deposition (PICVD) process, wherein at least one, for example all, of the following parameters is/are fulfilled:
   i) the process temperature PT1 is 200° C. to Tg of the glass of the glass element, for example 200° C. to 500° C., 220° C. to 450° C., 240° C. to 320° C., or 250° C. to 300° C.; and/or
   ii) the pulse duration PD1 of the plasma is 50 µs or less, for example 40 µs or less, 30 µs or less, 20 µs or less, 15 µs or less, 12 µs or less, 8 µs or less, 6 µs or less, 4 µs or less, or 3 µs; and/or
   iii) the pulse duration PD1 of the plasma is 0.1 µs or more, for example 0.5 µs or more, 1 µs or more, or 6 µs or more; and/or
   iv) the irradiation is carried out by a microwave generator, for example the ray has a frequency of 300 MHz to 300 GHz, 600 MHz to 100 GHz, 800 MHz to 10 GHz, 900 MHz to 3 GHz, or 2.45 GHz; and/or
   v) the input power IP1, for example the input power IP1 of the microwave generator, is 1,000 W to 10,000 W, for example 2,100 W to 8,000 W, 2,500 W to 6,700 W, 3,000 W to 6,000 W, 3,200 W to 5,500 W, or 4,000 W to 5,000 W; and/or vi) precursor P1 comprises one or more of hexamethyldisiloxane (HMDSO), hexamethyldisilazane (HMDS), tetramethylsilane (TMS), trimethylborazole (TMB), tri(dimethylaminosilyl)-amino-di (dimethylamino) borane (TDADB), tris(trimethylsilyl) borate (TMSB), hexamethylcyclotrisiloxane (HMCTSO), octamethylcyclotetrasiloxane (OMCTS), decamethylcyclopentasiloxane (DMCPS), dodecamethylcyclohexasiloxane (DMCHS) diacetoxy-di-t-butoxysilane (DADBS), tetraethoxysilane (TEOS), tris(trimethylsilyloxy) vinylsilane (TTMSVS), vinyltriethoxysilane (VTES) and/or combinations thereof; and/or vii) the precursor P1 comprises, for example consists of, the elements Si, C, O and H; and/or viii) the pulse pause PP1 between two pulses is 1 μs or more, for example 10 μs or more, 1 μs to 5 s, 0.1 ms to 10 ms, 0.2 ms to 2.0 ms, 0.3 ms to 1.2 ms, or 0.4 ms to 0.8 ms; and/or ix) the total time TT1 of irradiation is 0.1 s or more, for example 1 s or more, 1 s to 5 min, 3 s to 90 s, or 5 s to 40 s; and/or x) the ratio [μs/ms] of all pulse durations PD1 [μs] to all pulse pauses PP1 [ms] is 1 or more, for example 2 or more, 2 to 50, or 3 to 8; and/or xi) the process pressure PR1 is 0.01 mbar to 500 mbar, for example 0.1 mbar to 10 mbar, 0.3 mbar to 5 mbar, 0.6 mbar to 2.0 mbar, or 0.8 mbar; and/or xii) the process temperature is decreasing, such as steadily decreasing, during the coating process; and/or xiii) the process temperature PT1 is at least partially, for example at the time when coating process starts, 220° C. or more, such as 240° C. or more, 250° C. or more, 255° C. or more, 270° C. or more, or 280° C. or more; and/or xiv) the flow rate of the precursor P1 is 0.1 to 500 sccm, such as 5 to 100 sccm, 8 to 30 sccm, or 10 to 15 sccm.

10. Method, which may be according to any one of the preceding items, comprising the step:

performing a pretreating process on (the) at least part of the glass surface of a/the glass element, wherein the pretreating process is one or more, for example first the washing pretreatment and then the plasma pretreatment, of the following:
  i) a washing pretreatment; and/or
  ii) a plasma pretreatment; and/or
  iii) a corona pretreatment.

11. Method according to any one of the preceding items, wherein the washing pretreatment is spraying water to the at least part of the glass surface, wherein one or more, for example all, of the following parameters are fulfilled:
  i) the time of spraying is 1 s to 5 h, such as 5 s to 60 min, 1 min to 40 min, or 10 min to 40 min; and/or
  ii) the water conductivity is 0.1 μs/cm to 400 μs/cm, such as 0.5 μs/cm to 10 μs/cm, 1 μs/cm to 5 μs/cm, or about 2 μs/cm; and/or
  iii) the temperature of the water is 10° C. or more, such as 15° C. to 100° C., 20° C. to 80° C., or 25° C. to 40° C.

12. Method according to any one of the preceding items, wherein the plasma pretreatment is a plasma-enhanced chemical vapor treatment (PECVT) process, plasma impulse chemical vapor treatment (PICVT) process or plasma assisted chemical vapor treatment (PACVT) process, comprising the steps:

a) surrounding the at least part of the glass surface of the glass element with a precursor P2; and
b) irradiating the precursor P2 to generate a plasma;

wherein at least one, for example all, of the following parameters is/are fulfilled:
  i) the process temperature PT2 is room temperature to Tg of the glass of the glass element, for example room temperature to 450° C., room temperature to 400° C., room temperature to 320° C., or room temperature to 280° C.; and/or
  ii) the pulse duration PD2 of the plasma is 50 ms or less, for example 40 ms or less, 30 ms or less, 20 ms or less, 15 ms or less, 8 ms or less, 6 ms or less, 1 ms or less, or 0.5 ms; and/or
  iii) the pulse duration PD2 of the plasma is 0.1 ms or more, for example 0.2 ms or more, 0.3 ms or more, or 0.5 ms or more; and/or
  iv) the irradiation is carried out by a microwave generator, for example the ray has a frequency of 300 MHz to 300 GHz, 600 MHz to 100 GHz, 800 MHz to 10 GHz, 900 MHz to 3 GHz, or 2.45 GHz; and/or
  v) the input power IP2, for example the input power IP2 of the microwave generator, is 1,000 W to 10,000 W, for example 2,500 W to 8,000 W, 4,000 W to 8,000 W, 5,000 W to 7000 W, 5,000 W to 6500 W, or 5250 W to 5750 W; and/or
  vi) the precursor P2 comprises argon, oxygen and/or nitrogen and/or precursor P2 is air; and/or
  vii) the precursor P2 comprises, for example consists of, the elements N, e.g. $N_2$, and/or O, e.g. $O_2$; and/or
  viii) the pulse pause PP2 between two pulses is 1 μs or more, for example 10 μs or more, 1 μs to 5 s, 0.1 ms to 10 ms, 0.5 ms to 2.0 ms, 1.5 ms to 2.0 ms, or 1.8 ms; and/or
  ix) the total time TT2 of irradiation is 0.1 s or more, for example 1 s or more, 1 s to 5 min, or 5 s to 15 s; and/or
  x) the ratio [ms/ms] of all pulse durations PD2 [ms] to all pulse pauses PP2 [ms] is 0.05 or more, for example 0.1 or more, 0.15 to 5, or 0.2 to 0.5; and/or
  xi) the process pressure PR2 is 0.01 mbar to 500 mbar, for example 0.1 mbar to 100 mbar, 0.5 mbar to 10 mbar, 0.8 mbar to 6.0 mbar, or 1.0 mbar to 4.0 mbar; and/or
  xii) the process temperature PT2 is increasing, for example steadily increasing, during the plasma pretreatment; and/or
  xiii) the process temperature PT2 is at least partially, for example at the time when the plasma pretreatment process ends, 220° C. or more, such as 240° C. or more, 250° C. or more, 255° C. or more, 270° C. or more, or 280° C. or more; and/or
  xiv) the flow rate of the precursor P2 is 0.1 to 500 sccm, for example 5 to 100 sccm, 8 to 50 sccm, or 20 to 30 sccm.

13. Method according to any one of the preceding items, wherein the corona pretreatment comprises the steps:

positioning the at least part of the glass surface of the glass element between a first and a second electrode; and surrounding the at least part of the glass surface of the glass element with a precursor P3; and applying a voltage V1 between the first and the second electrode;

wherein at least one, for example all, of the following parameters is/are fulfilled:
  i) the first electrode is made of brass; and/or
  ii) the second electrode is made of aluminum; and/or iii) the precursor P3 is selected from, oxygen, nitrogen, air, and/or mixtures thereof; and/or
iv) the process pressure PR3 is 100 mbar to 2000 mbar, for example 500 mbar to 1500 mbar or 900 mbar to 1200 mbar; and/or
v) the time of applying the voltage V1 is 0.1 s to 30 s, for example 0.5 s to 5 s; and/or
vi) the voltage V1 is 1 kV to 10 kV, for example 2 kV to 5 kV; and/or
vii) the frequency of the voltage V1 is 1 to 50 kHz, for example 10 to 30 kHz or 12 to 18 kHz.

14. Method according to any one of the preceding items, wherein the pretreating process is performed before the coating process.

15. Method according to any one of the preceding items, wherein the time between the pretreating process(es) and the coating process is 1 year or less, for example 6 months or less, 1 day or less, 1 hour or less, 1 minute or less, 30 seconds or less, 20 seconds or less, or 15 seconds or less; and/or 1 second or more, for example 3 seconds or more, 8 seconds or more, or 10 seconds or more.

16. Method according to any one of the preceding items, comprising the step:
   performing a post-processing on the at least part of the glass surface of the glass element, wherein the post-processing comprises the step:
      surrounding the at least part of the glass surface of the glass element with a precursor P4 comprising argon, oxygen and/or nitrogen; and optionally cooling the glass element, to room temperature, in the presence of the precursor P4.

17. Method according to any one of the preceding items, wherein the post-processing is performed after the coating process.

18. Pretreated glass element, which may be obtainable by a method according to any one of the preceding items, wherein at least part of the glass surface of the glass element fulfills one or more of the following parameters:
   i) the ratio of the polar part of the surface energy [mN/m] to the disperse part of the surface energy [mN/m] is 1.4 or less, for example 0.10 to 1.44, 0.50 to 1.40, or 1.00 to 1.35; and/or
   ii) the polar part of the surface energy is 39.50 mN/m or less, for example 20.00 mN/m to 39.50 mN/m, 36.00 to 38.50 mN/m, or 36.50 to 38.00 mN/m; and/or
   iii) the disperse part of the surface energy is 27.5 mN/m or more, for example 27.50 mN/m to 40.00 mN/m, 28.00 mN/m to 35.00 mN/m, or 29.00 mN/m to 32.50 mN/m.

19. Use of a pretreated glass element according to any one of the preceding items in a method comprising a coating process, wherein the coating process comprises a CVD process, a PECVD, PICVD or PACVD process.

20. Use of a pretreated glass element according to any one of the preceding items in a method according to any one of the following items.

21. Coated glass element comprising a glass surface, wherein the glass element is a container, for example a pharmaceutical glass container, wherein at least part of the glass surface is coated by a coating, wherein the coating comprises at least one layer, wherein the coated glass container fulfills the following parameter: leaching of [Na] ions after an alkaline treatment is 10 mg/l or less [Na] ions.

22. Coated glass element according to any one of the preceding items, wherein the coated glass container fulfills the following parameter: leaching of [Na] ions after an heat treatment and alkaline treatment is 10 mg/l or less [Na] ions.

23. Coated glass element according to any one of the preceding items, wherein the leaching of [Na] ions after an alkaline treatment, for example a heat and alkaline treatment, is 9 mg/l or less [Na] ions, for example 7 mg/l or less [Na] ions, 5 mg/l or less [Na] ions, 4 mg/l or less [Na] ions, 3 mg/l or less [Na] ions, 2 mg/l or less [Na] ions, 1 mg/l or less [Na] ions, 0.7 mg/l or less [Na] ions, 0.3 mg/l or less [Na] ions, 0.2 mg/l or less [Na] ions, or 0.1 mg/l or less [Na] ions.

24. Coated glass element according to any one of the preceding items, wherein the leaching of [Na] ions after an alkaline treatment, for example a heat and alkaline treatment, is 0 mg/l or more [Na] ions, for example 0.001 mg/l or more [Na] ions, 0.01 mg/l or more [Na] ions, or 0.1 mg/l or more [Na] ions.

25. Coated glass element, which may be according to any one of the preceding items, comprising a glass surface, wherein the glass element is a container, for example a pharmaceutical glass container, wherein at least part of the glass surface is coated by a coating, wherein the coating comprises at least one layer, wherein the leaching of [Na] ions after an alkaline treatment, for example a heat and alkaline treatment, is a;
   wherein $a \leq b*c$;
   wherein, if 0.9×(brimful volume) of the container is ≤1 ml, b is 5.00 mg/ml,
   wherein, if 0.9×(brimful volume) of the container is >1 ml and ≤2 ml, b is 4.50 mg/l,
   wherein, if 0.9×(brimful volume) of the container is >2 ml and ≤3 ml, b is 4.10 mg/ml,
   wherein, if 0.9×(brimful volume) of the container is >3 ml and ≤5 ml, b is 3.20 mg/ml,
   wherein, if 0.9×(brimful volume) of the container is >5 ml and ≤10 ml, b is 2.50 mg/ml,
   wherein, if 0.9×(brimful volume) of the container is >10 ml and ≤20 ml, b is 2.00 mg/ml,
   wherein, if 0.9×(brimful volume) of the container is >20 ml and ≤50 ml, b is 1.50 mg/ml,
   wherein, if 0.9×(brimful volume) of the container is >50 ml and ≤100 ml, b is 1.20 mg/ml,
   wherein, if 0.9×(brimful volume) of the container is >100 ml and ≤200 ml, b is 1.00 mg/ml,
   wherein, if 0.9×(brimful volume) of the container is >200 ml and ≤500 ml, b is 0.75 mg/l; and
   wherein, if 0.9×(brimful volume) of the container is >500 ml, b is 0.50 mg/l; and
   wherein c is 1.00, 0.90, 0.80, 0.70, 0.60, 0.50, 0.40, 0.30, 0.20, 0.15, 0.10, 0.08, or 0.05.

26. Coated glass element, which may be according to any one of the preceding items, comprising a glass surface, wherein the glass element is a container, for example a pharmaceutical glass container, wherein at least part of the glass surface is coated by a coating, wherein the coating comprises at least one layer, wherein the coated glass container fulfills the following parameter:
   leaching of [Si], [B], [Al] and/or [Ca] ions [mg/ml] after storage of 3 years at pH 8 is:
   25 mg/l [Si] ions or less, for example 3.7 mg/l [Si] ions or less or 1.0 to 3.0 mg/l [Si] ions; and/or
   1.0 mg/l [B] ions or less, for example 0.5 mg/l [B] ions or less or 0.001 to 0.2 mg/l [B] ions; and/or
   1.0 mg/l [Al] ions or less, for example 0.5 mg/l [Al] ions or less or 0.001 to 0.14 mg/l [Al] ions; and/or
   10 mg/l [Ca] ions or less, for example 5 mg/l [Ca] ions or less or 1.0 to 4.9 mg/l [Ca] ions.

27. Coated glass element, which may be according to any one of the preceding items, comprising a glass surface, wherein the glass element is a container, for example a pharmaceutical glass container, wherein at least part of the glass surface is coated by a coating, wherein the coating comprises at least one layer, wherein the coated glass container fulfills the following parameter:
leaching of [Si], [B], [Al] and/or [Ca] ions [mg/ml] after storage of 3 years at pH 5.5 is:
1.30 mg/l [Si] ions or less, for example 1.10 mg/l [Si] ions or less or 0.001 to 0.60 mg/l [Si] ions; and/or
0.1 mg/l [B] ions or less, for example 0.05 mg/l [B] ions or less or 0.001 to 0.004 mg/l [B] ions; and/or
0.1 mg/l [Al] ions or less, for example 0.01 mg/l [Al] ions or less or 0.001 to 0.0004 mg/l [Al] ions; and/or
0.1 mg/l [Ca] ions or less, for example 0.05 mg/l [Ca] ions or less or 0.001 to 0.004 mg/l [Ca] ions.

28. Coated glass element, which may be according to any one of the preceding items, comprising a glass surface, wherein at least part of the glass surface is coated by a coating, wherein the coating comprises at least one layer, wherein the at least one layer of the coating fulfills the following parameter:

$$[Al^+]_{80}/[Al^+]_{20} \geq 1.8;$$

wherein $[Al^+]_{20}$ are the counts of $[Al^+]$ ions, measured by a TOF-SIMS, at 20% of the time a sputter gun needs to reach the glass surface; and
wherein $[Al^+]_{80}$ are the counts of $[Al^+]$ ions, measured by a TOF-SIMS, at 80% of the time a sputter gun beam needs to reach the glass surface.

29. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$$[Al^+]_{80}/[Al^+]_{20} \geq x1_{[Al+]};$$

wherein $x1_{[Al+]}$ is 2.0, 3, 5, 7, 10, 15, 20, or 25; and/or $$[Al^+]_{80}/[Al^+]_{20} \leq x2_{[Al+]};$$

wherein $x2_{[Al+]}$ is 500, 200, 100, 50, 40, 35, 30, 29, or 28.

30. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$$y1_{[Al+]} \leq [Al^+]_{80}/[Al^+]_{60} \leq y2_{[Al+]},$$

$$y1_{[Al+]} \leq [Al^+]_{60}/[Al^+]_{40} \leq y2_{[Al+]}, \text{ and/or}$$

$$y1_{[Al+]} \leq [Al^+]_{40}/[Al^+]_{20} \leq y2_{[Al+]},$$

wherein $y1_{[Al+]}$ is 1.01, 2, 3, 5, 10, 15, 20, or 25; and/or
wherein $y2_{[Al+]}$ is 500, 200, 100, 50, 40, 30, 20, 10, or 5; and
wherein $[Al^+]_{40}$ are the counts of $[Al^+]$ ions, measured by a TOF-SIMS, at 40% of the time a sputter gun beam needs to reach the glass surface; and
wherein $[Al^+]_{60}$ are the counts of $[Al^+]$ ions, measured by a TOF-SIMS, at 60% of the time a sputter gun beam needs to reach the glass surface.

31. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$$[SiCH_3^+]_{20}/[SiCH_3^+]_{80} \geq x1_{[SiCH3+]};$$

wherein $x1_{[SiCH3+]}$ is 1.05, 1.1, 1.2, 1.4, 1.6, 1.7, or 1.8, and/or $$[SiCH_3^+]_{20}/[SiCH_3^+]_{80} \leq x2_{[SiCH3+]};$$

wherein $x2_{[SiCH3+]}$ is 100, 75, 50, 40, 30, 20, 10, 5, 2, or 1.8; and
wherein $[SiCH_3^+]_{20}$ are the counts of $[SiCH_3^+]$ ions, measured by a TOF-SIMS, at 20% of the time a sputter gun beam needs to reach the glass surface; and
wherein $[SiCH_3^+]_{80}$ are the counts of $[SiCH_3^+]$ ions, measured by a TOF-SIMS, at 80% of the time a sputter gun beam needs to reach the glass surface.

32. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$$y1_{[SiCH3+]} \leq [SiCH_3^+]_{20}/[SiCH_3^+]_{40} \leq y2_{[SiCH3+]},$$

$$y1_{[SiCH3+]} \leq [SiCH_3^+]_{40}/[SiCH_3^+]_{60} \leq y2_{[SiCH3+]}, \text{ and/or}$$

$$y1_{[SiCH3+]} \leq [SiCH_3^+]_{60}/[SiCH_3^+]_{80} \leq y2_{[SiCH3+]};$$

wherein $y1_{[SiCH3+]}$ is 1.0, 1.1, 1.2, 1.4, or 1.5; and/or
wherein $y2_{[SiCH3+]}$ is 100, 75, 50, 40, 30, 20, 10, 5, 2, or 1.5; and
wherein $[SiCH_3^+]_{20}$ are the counts of $[SiCH_3^+]$ ions, measured by a TOF-SIMS, at 20% of the time a sputter gun beam needs to reach the glass surface;
wherein $[SiCH_3^+]_{40}$ are the counts of $[SiCH_3^+]$ ions, measured by a TOF-SIMS, at 40% of the time a sputter gun beam needs to reach the glass surface;
wherein $[SiCH_3^+]_{60}$ are the counts of $[SiCH_3^+]$ ions, measured by a TOF-SIMS, at 60% of the time a sputter gun beam needs to reach the glass surface; and
wherein $[SiCH_3^+]_{80}$ are the counts of $[SiCH_3^+]$ ions, measured by a TOF-SIMS, at 80% of the time a sputter gun beam needs to reach the glass surface.

33. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$$[Si_3C_5H_{15}O_3^+]_{20}/[Si_3C_5H_{15}O_3^+]_{80} \geq x1_{[Si3C5H15O3+]};$$

wherein $x1_{[Si3C5H15O3+]}$ is 1.2, 2, 3, 5, or 8; and/or $$[Si_3C_5H_{15}O_3^+]_{20}/[Si_3C_5H_{15}O_3^+]_{80} \leq x2_{[Si3C5H15O3+]};$$

wherein $x2_{[Si3C5H15O3+]}$ is 100, 75, 50, 40, 30, 20, 15, 12, 10, or 9; and
wherein $[Si_3C_5H_{15}O_3^+]_{20}$ are the counts of $[Si_3C_5H_{15}O_3^+]$ ions, measured by a TOF-SIMS, at 20% of the time a sputter gun beam needs to reach the glass surface; and/or
wherein $[Si_3C_5H_{15}O_3^+]_{80}$ are the counts of $[Si_3C_5H_{15}O_3^+]$ ions, measured by a TOF-SIMS, at 80% of the time a sputter gun beam needs to reach the glass surface.

34. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$y1_{[Si3C5H15O3+]} \leq [Si_3C_5H_{15}O_3^+]_{20}/[Si_3C_5H_{15}O_3^+]_{40} \leq y2_{[Si3C5H15O3+]};$ $y1_{[Si3C5H15O3+]} \leq [Si_3C_5H_{15}O_3^+]_{40}/[Si_3C_5H_{15}O_3^+]_{60} \leq y2_{[Si3C5H15O3+]};$ and/or $y1_{[Si3C5H15O3+]} \leq [Si_3C_5H_{15}O_3^+]_{60}/[Si_3C_5H_{15}O_3^+]_{80} \leq y2_{[Si3C5H15O3+]};$ wherein $y1_{[Si3C5H15O3+]}$ is 1.0, 1.1, 1.5, 2, or 2.0; and/or
wherein $y2_{[Si3C5H15O3+]}$ is 100, 75, 50, 40, 30, 20, 10, 5, 2, or 1.5; and
wherein $[Si_3C_5H_{15}O_3^+]_{20}$ are the counts of $[Si_3C_5H_{15}O_3^+]$ ions, measured by a TOF-SIMS, at 20% of the time a sputter gun beam needs to reach the glass surface;
wherein $[Si_3C_5H_{15}O_3^+]_{40}$ are the counts of $[Si_3C_5H_{15}O_3^+]$ ions, measured by a TOF-SIMS, at 40% of the time a sputter gun beam needs to reach the glass surface;
wherein $[Si_3C_5H_{15}O_3^+]_{60}$ are the counts of $[Si_3C_5H_{15}O_3^+]$ ions, measured by a TOF-SIMS, at 60% of the time a sputter gun beam needs to reach the glass surface; and
wherein $[Si_3C_5H_{15}O_3^+]_{80}$ are the counts of $[Si_3C_5H_{15}O_3^+]$ ions, measured by a TOF-SIMS, at 80% of the time a sputter gun beam needs to reach the glass surface.

35. Coated glass element, which may be according to any one of the preceding items, comprising a glass surface, wherein at least part of the glass surface is coated by a coating, wherein the coating comprises at least one layer, wherein the at least one layer of the coating fulfills the following parameter:

$[Si_2C_5H_{15}O_2^-]_{20}/[Si_2C_5H_{15}O_2^-]_{80} \geq 1.0;$ wherein $[Si_2C_5H_{15}O_2^-]_{20}$ are the counts of $[Si_2C_5H_{15}O_2^-]$ ions, measured by a TOF-SIMS, at 20% of the time a sputter gun beam needs to reach the glass surface; and
wherein $[Si_2C_5H_{15}O_2^-]_{80}$ are the counts of $[Si_2C_5H_{15}O_2^-]_{80}$ ions, measured by a TOF-SIMS, at 80% of the time a sputter gun beam needs to reach the glass surface.

36. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$[Si_2C_5H_{15}O_2^-]_{20}/[Si_2C_5H_{15}O_2^-]_{80} \cdot x1_{[Si2C5H15O2-]};$ wherein $x1_{[Si2C5H15O2-]}$ is 1.2, 1.5, 2, 3, 5, 8, or 12; and/or $[Si_2C_5H_{15}O_2^-]_{20}/[Si_2C_5H_{15}O_2^-]_{80} \leq x2_{[Si2C5H15O2-]};$ wherein $x2_{[Si2C5H15O2-]}$ is 100, 75, 50, 40, 30, 25, 20, 18, 15, or 14.

37. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$z1_{[Si2C5H15O2-]} \leq [Si_2C_5H_{15}O_2^-]_{20}/[Si_2C_5H_{15}O_2^-]_{40} \leq z2_{[Si2C5H15O2-]};$ $z1_{[Si2C5H15O2-]} \leq [Si_2C_5H_{15}O_2^-]_{40}/[Si_2C_5H_{15}O_2^-]_{60} \leq z2_{[Si2C5H15O2-]};$ and/or $z1_{[Si2C5H15O2-]} \leq [Si_2C_5H_{15}O_2^-]_{60}/[Si_2C_5H_{15}O_2^-]_{80} \leq z2_{[Si2C5H15O2-]};$ wherein $z1_{[Si2C5H15O2-]}$ is 1.0, 1.1, 1.4, 1.5, 1.6, 2.0, or 2.4; and/or wherein $z2_{[Si2C5H15O2-]}$ is 100, 75, 50, 40, 30, 20, 10, 5, 3, 2, or 1.5; and
wherein $[Si_2C_5H_{15}O_2^-]_{40}$ are the counts of $[Si_2C_5H_{15}O_2^-]$ ions, measured by a TOF-SIMS, at 40% of the time a sputter gun beam needs to reach the glass surface; and
wherein $[Si_2C_5H_{15}O_2^-]_{60}$ are the counts of $[Si_2C_5H_{15}O_2^-]$ ions, measured by a TOF-SIMS, at 60% of the time a sputter gun beam needs to reach the glass surface.

38. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$[Si_2C_3H_9O_3^-]_{20}/[Si_2C_3H_9O_3^-]_{80} \geq x1_{[Si2C3H9O3-]};$ wherein $x1_{[Si2C3H9O3-]}$ is 1.1, 1.5, 2, or 3; and/or $[Si_2C_3H_9O_3^-]_{20}/[Si_2C_3H_9O_3^-]_{80} \leq x2_{[Si2C3H9O3-]};$ wherein $x2_{[Si2C3H9O3-]}$ is 100, 75, 50, 40, 30, 20, 10, 8, 6, 5, or 4; and
wherein $[Si_2C_3H_9O_3^-]_{20}$ are the counts of $[Si_2C_3H_9O_3^-]$ ions, measured by a TOF-SIMS, at 20% of the time a sputter gun beam needs to reach the glass surface; and
wherein $[Si_2C_3H_9O_3^-]_{80}$ are the counts of $[Si_2C_3H_9O_3^-]_{80}$ ions, measured by a TOF-SIMS, at 80% of the time a sputter gun beam needs to reach the glass surface.

39. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$x1_{[Si2C3H9O3-]} \leq [Si_2C_3H_9O_3^-]_{20}/[Si_2C_3H_9O_3^-]_{40} \leq x2_{[Si2C3H9O3-]};$ $x1_{[Si2C3H9O3-]} \leq [Si_2C_3H_9O_3^-]_{40}/[Si_2C_3H_9O_3^-]_{60} \leq x2_{[Si2C3H9O3-]};$ and/or $x1_{[Si2C3H9O3-]} \leq [Si_2C_3H_9O_3^-]_{60}/[Si_2C_3H_9O_3^-]_{80} \leq x2_{[Si2C3H9O3-]};$ and wherein $x1_{[Si2C3H9O3-]}$ is 1.05, 1.1, 1.5, 2, or 3; and/or
wherein $x2_{[Si2C3H9O3-]}$ is 100, 75, 50, 40, 30, 20, 10, 5, 3, 2, or 1.5; and
wherein $[Si_2C_3H_9O_3^-]_{20}$ are the counts of $[Si_2C_3H_9O_3^-]$ ions, measured by a TOF-SIMS,
at 20% of the time a sputter gun beam needs to reach the glass surface;
wherein $[Si_2C_3H_9O_3^-]_{40}$ are the counts of $[Si_2C_3H_9O_3^-]$ ions, measured by a TOF-SIMS, at 40% of the time a sputter gun beam needs to reach the glass surface;
wherein $[Si_2C_3H_9O_3^-]_{60}$ are the counts of $[Si_2C_3H_9O_3^-]$ ions, measured by a TOF-SIMS, at 60% of the time a sputter gun beam needs to reach the glass surface;
wherein $[Si_2C_3H_9O_3^-]_{80}$ are the counts of $[Si_2C_3H_9O_3^-]_{80}$ ions, measured by a TOF-SIMS, at 80% of the time a sputter gun beam needs to reach the glass surface.

40. Coated glass element, which may be according to any one of the preceding items, comprising a glass surface, wherein at least part of the glass surface is coated by a coating, wherein the coating comprises at least one layer, wherein the at least one layer of the coating fulfills the following parameter(s):

$[AlO_2^-]_{90}/[AlO_2^-]_{20} \geq x1_{[AlO2-]};$ wherein $x1_{[AlO2-]}$ is 1.3, 1.5, 1.8, or 2.0; and/or $[AlO_2^-]_{90}/[AlO_2^-]_{20} \leq x2_{[AlO2-]};$ wherein $x2_{[AlO2-]}$ is 100, 75, 50, 40, 30, 20, 10, 5, 3, 2, or 1.5; and wherein $[AlO_2^-]_{20}$ are the counts of $[AlO_2^-]$ ions, measured by a TOF-SIMS, at 20% of the time a sputter gun beam needs to reach the glass surface; and wherein $[AlO_2^-]_{90}$ are the counts of $[AlO_2^-]_{90}$ ions, measured by a TOF-SIMS, at 90% of the time a sputter gun beam needs to reach the glass surface.

41. Coated glass element according to any one of the preceding items, wherein the at least one layer comprises the elements Si, O and C measured by XPS.

42. Coated glass element according to any one of the preceding items, wherein the at least one layer comprises $SiO_xC_y$ measured by XPS, wherein x is from 0.3 to 3.0, for example 0.5 to 2.0 or 0.9 to 1.5, and/or wherein y is from 0 to 6.0, for example 0.5 to 4.0 or 2.5 to 3.5.

43. Coated glass element according to any one of the preceding items, wherein the thickness of the coating is 1 nm to 1 mm, for example 10 nm to 0.5 mm or 20 nm to 100 nm.

44. Coated glass element according to any one of the preceding items, wherein the at least one layer is obtainable by a CVD process, for example a PECVD, PICVD or PACVD process.

45. Coated glass element according to any one of the preceding items, wherein the at least one layer is obtainable by the method according to any one of the preceding items.

46. Coated glass element according to any one of the preceding items, wherein the coating consists of the at least one layer; and/or wherein the coating is obtainable by one coating process; and/or wherein the coating is a single layer coating.

47. Coated glass element according to any one of the preceding items, wherein the at least one layer is in direct contact with the glass surface of the glass element and/or the glass surface of the pretreated glass element.

48. Coated glass element according to any one of the preceding items, wherein the at least one layer is the outermost layer and/or wherein the coating faces to the lumen of the glass element.

49. Coated glass element according to any one of the preceding items, wherein the coating is a multilayer coating.

50. Closed coated glass element, comprising: the coated glass element according to any one of the preceding items, and a closure system, for example a stopper and/or a cap.

51. Closed coated glass element, comprising: the coated glass element according to any one of the preceding items, and a plunger and/or a plunger rod; and/or a closure system, for example a tip cap and/or a needle shield.

52. Closed coated glass element according to any one of the preceding items, wherein the closed coated glass element passes the container closure integrity test according to DIN EN ISO 8871-5:2016; chapter 4.4 in combination with Annex D.

53. Filled coated glass element, comprising: the coated glass element according to any one of the preceding items, and a composition, for example a pharmaceutical composition, a composition containing biologics and/or mRNA.

54. Coated glass element according to any one of the preceding items, wherein the time a sputter gun needs to reach the glass surface is 0.5 to 60 minutes, for example 1 to 10 minutes or 2 to 4 minutes; and/or wherein in the case positive ions are measured, the point, when the sputter gun reaches the glass surface is the point, when the ratio of the counts of $[Al^+]$ ions to the counts of $[Si^+]$ ions is equal to or exceeds a value of 0.10 for the first time; and/or wherein in the case negative ions were measured, the point, when the sputter gun reaches the glass surface is the point, when the ratio of the counts of $[AlO_2^-]$ ions to the counts of $[Si^-]$ ions is equal to or exceeds a value of 0.10 for the first time; and/or wherein the counts of the ions, for example the ions $[AlO_2^-]$, $[Si_2C_3H_9O_3^-]$, $[Si_2C_5H_{15}O_2^-]$, $[Si_3C_5H_{15}O_3^+]$, $[Al^+]$, and/or $[SiCH_3^+]$, are obtainable by the method described in the description.

55. Method, use, glass element, coated glass element and/or filled coated glass element according to any one of the preceding items, wherein the glass is a borosilicate glass, an aluminosilicate glass, or a lithium-aluminosilicate (LAS) glass.

56. Method, use, glass element, coated glass element and/or filled coated glass element according to any one of the preceding items, wherein the composition of the glass comprises, in mass-%:
$SiO_2$: 30 to 98%, for example 50 to 90% or 70.0 to 74.0%; and/or
$B_2O_3$: 0 to 30%, for example 3 to 20% or 7.0 to 16.0%; and/or
$Al_2O_3$: 0 to 30%, for example 1 to 15% or 3.0 to 6.5%; and/or
$X_2O$: 0 to 30%, for example 1 to 15% or 2.0 to 7.2%, wherein X is selected from Na, K, and/or Li; and/or
YO: 0 to 30%, for example 0.1 to 5% or 0.5 to 1.0%, wherein Y is selected from Ca, Mg, and/or Ba.

57. Method, use, glass element, coated glass element and/or filled coated glass element according to any one of the preceding items, wherein the composition of the glass consists of, in mass-%:
$SiO_2$: 30 to 98%, for example 50 to 90% or 70.0 to 74.0%;
$B_2O_3$: 0 to 30%, for example 3 to 20% or 7.0 to 16.0%;
$Al_2O_3$: 0 to 30%, for example 1 to 15% or 3.0 to 6.5%;
$X_2O$: 0 to 30%, for example 1 to 15% or 2.0 to 7.2%, wherein X is selected from Na, K, and/or Li;
YO: 0 to 30%, for example 0.1 to 5% or 0.5 to 1.0%, wherein Y is selected from Ca, Mg, and/or Ba; and unavoidable impurities.

58. Method, use, glass element, coated glass element and/or filled coated glass element according to any one of the preceding items, wherein the composition of the glass comprises, in mass-%:
$SiO_2$: 20 to 98%, for example 40 to 75% or 50 to 65%; and/or
$B_2O_3$: 0 to 30%, for example 1 to 15% or 3 to 9%; and/or
$Al_2O_3$: 0 to 30%, for example 10 to 20% or 13 to 18; and/or
$X_2O$: 0 to 30%, for example 0 to 5%, 0 to 3%, wherein X is selected from Na, K, and/or Li; and/or
YO: 0 to 50%, for example 0.1 to 40% or 10 to 35, wherein Y is selected from Ca, Mg, and/or Ba.

59. Method, use, glass element, coated glass element and/or filled coated glass element according to any one of the preceding items, wherein the composition of the glass consists of, in mass-%:
$SiO_2$: 20 to 98%, for example 40 to 75% or 50 to 65%;
$B_2O_3$: 0 to 30%, for example 1 to 15% or 3 to 9%;
$Al_2O_3$: 0 to 30%, for example 10 to 20% or 13 to 18%;
$X_2O$: 0 to 30%, for example 0 to 5% or 0 to 3%, wherein X is selected from Na, K, and/or Li;
YO: 0 to 50%, for example 0.1 to 40% or 10 to 35, wherein Y is selected from Ca, Mg, and/or Ba; and unavoidable impurities.

60. Method, use, glass element, coated glass element and/or filled coated glass element according to any one of the preceding items, wherein the glass element is a container, a pharmaceutical container, a vial, syringe, ampoule or cartridge.

61. Method, use, glass element, coated glass element and/or filled coated glass element according to any one of the preceding items, wherein the brimful volume of the container is 0.1 ml to 1,000 ml, for example 0.5 ml to 500 ml, 1 ml to 250 ml, 2 ml to 30 ml, 2 ml to 15 ml, about 1 ml, 2 ml, 3 ml, 4, ml, 5 ml, 6 ml, 7 ml, 8 ml, 9 ml, 10 ml, 11 ml, 12 ml, 13 ml, 14 ml, 15 ml, or 5 to 15 ml.

62. Method, use, glass element, coated glass element and/or filled coated glass element according to any one of the preceding items, wherein the glass element is a tube or container, wherein the glass element comprises an inner surface, wherein the inner surface comprises, for example is, the at least part of the glass surface.

63. Method, use, glass element, coated glass element and/or filled coated glass element according to any one of the preceding items, wherein the glass element is a tube or container, wherein the glass element comprises an outer surface and wherein the outer surface comprises, for example is, the at least part of the glass surface.

64. Method, use, glass element, coated glass element and/or filled coated glass element according to any one of the preceding items, wherein the glass element is a vial or a cartridge comprising a cylindrical portion, a neck and a crown, wherein at least the inner surface of the cylindrical portion is coated by the coating.

65. Method, use, glass element, coated glass element and/or filled coated glass element according to any one of the preceding items, wherein the at least part of the glass surface of the container comprises at least part of the inner surface of the container, for example the at least part of the glass surface of the container is the surface which is in contact with a liquid when the container evenly stands on the ground and is filled with a liquid having a volume of 10 or more, 30% or more, or 90% or more with respect to the brimful volume [vol./vol.] of the container.

66. Method, use, glass element, coated glass element and/or filled coated glass element according to any one of the preceding items,
wherein the glass element is a vial or a cartridge comprising a cylindrical portion, a neck and a crown, wherein the crown, and for example also the neck, are uncoated and/or
wherein the glass element is a syringe comprising a flange, a cylindrical portion and a tip, and for example also a needle, wherein the needle, and also the flange, and the tip, are uncoated.

REFERENCE NUMERAL LIST

1 glass surface
2 coating
3 pretreated glass surface
1001 pretreatment
1002 coating process
1003 post-processing

What is claimed is:

1. A coated glass container, comprising:
a glass surface; and
a coating that coats at least part of the glass surface to form a coated glass surface, the coating comprising at least one layer, wherein the coated glass container fulfills the following parameter:
leaching of [Na] ions after an alkaline treatment is 1 mg/l or less [Na] ions, wherein the container defines a brimful volume and the alkaline treatment comprises filling the container with 0.9× the brimful volume of a 0.005 mol/l KOH-solution and demineralized water, closing the container, autoclaving the container for 3 hours at 121° C. at 2 bar, emptying the container, and washing the container two times with deionized water.

2. The coated glass container of claim 1, wherein the coated glass surface fulfills the following parameter:
leaching of [Na] ions after a heat treatment and the alkaline treatment is 1 mg/l or less [Na] ions.

3. The coated glass container of claim 2, wherein the coated glass surface fulfills the following parameter:
the leaching of [Na] ions after the heat treatment and the alkaline treatment is 0.001 mg/l or more [Na] ions.

4. The coated glass container of claim 1, wherein the leaching of [Na] ions after the alkaline treatment is 0.001 mg/l or more [Na] ions.

5. The coated glass container of claim 4, wherein the leaching of [Na] ions after the alkaline treatment is 0.01 mg/l or more [Na] ions.

6. The coated glass container of claim 1, wherein the coated glass container fulfills at least one of the following parameters:
leaching of [Si] ions in mg/l after storage of 3 years at pH 8 is 25 mg/l [Si] ions or less;
leaching of [B] ions in mg/l after storage of 3 years at pH 8 is 1.0 mg/l [B] ions or less;
leaching of [Al] ions in mg/l after storage of 3 years at pH 8 is 1.0 mg/l [Al] ions or less; or
leaching of [Ca] ions in mg/l after storage of 3 years at pH 8 is 10 mg/l [Ca] ions or less,
wherein the storage of 3 years at pH 8 comprises filling the container with 0.2× the brimful volume with a sodium bicarbonate solution having pH 8 diluted with 4 liters demineralized water, closing the container, and storing the closed container at 25° C. for 3 years.

7. The coated glass container of claim 6, wherein the coated glass container fulfills at least one of the following parameters:
leaching of [Si] ions in mg/l after storage of 3 years at pH 8 is 1.0 to 3.0 mg/l [Si] ions;
leaching of [B] ions in mg/l after storage of 3 years at pH 8 is 0.001 to 0.2 mg/l [B] ions;
leaching of [Al] ions in mg/l after storage of 3 years at pH 8 is 0.001 to 0.14 mg/l [Al] ions; or
leaching of [Ca] ions in mg/l after storage of 3 years at pH 8 is 1.0 to 4.9 mg/l [Ca] ions.

8. The coated glass container of claim 1, wherein the coated glass container fulfills at least one of the following parameters:
leaching of [Si] ions in mg/l after storage of 3 years at pH 5.5 is 1.30 mg/l [Si] ions or less;
leaching of [B] ions in mg/l after storage of 3 years at pH 5.5 is 0.1 mg/l [B] ions or less;
leaching of [Al] ions in mg/l after storage of 3 years at pH 5.5 is 0.1 mg/l [Al] ions or less; or
leaching of [Ca] ions in mg/l after storage of 3 years at pH 5.5 is 0.05 mg/l [Ca] ions or less,
wherein the storage of 3 years at pH 5.5 comprises filling the container with 0.2× the brimful volume of ultrapure water having a pH of 5.5, closing the container, and storing the closed container at 25° C. for 3 years.

9. The coated glass container of claim 8, wherein the coated glass container fulfills at least one of the following parameters:
leaching of [Si] ions in mg/l after storage of 3 years at pH 5.5 is 0.001 to 0.60 mg/l [Si] ions;

leaching of [B] ions in mg/l after storage of 3 years at pH 5.5 is 0.001 to 0.004 mg/l [B] ions;

leaching of [Al] ions in mg/l after storage of 3 years at pH 5.5 is 0.001 to 0.004 mg/l [Al] ions; or leaching of [Ca] ions in mg/l after storage of 3 years at pH 5.5 is 0.001 to 0.004 mg/l [Ca] ions.

10. The coated glass container of claim 1, further comprising at least one of:

a closure system; or at least one of a plunger or a plunger rod.

11. The coated glass container of claim 10, wherein the coated glass container comprises a closure system to form a closed coated glass container, the closure system comprising at least one of a stopper, a cap, a tip cap, or a needle shield.

12. The coated glass container of claim 1, further comprising a composition present in the coated glass container to form a filled coated glass container.

13. The filled coated glass container of claim 12, wherein the composition comprises at least one of a pharmaceutical composition, a composition containing biologics, or a composition containing mRNA.

14. A coated glass container, comprising:

a glass surface; and a coating that coats at least part of the glass surface to form a coated glass surface, the coating comprising at least one layer, wherein the coated glass container fulfills at least one of the following parameters:

leaching of [Si] ions in mg/l after storage of 3 years at pH 8 is 25 mg/l [Si] ions or less; or leaching of [B] ions in mg/l after storage of 3 years at pH 8 is [1.0]<0.1 mg/l [B] ions;

wherein the storage of 3 years at pH 8 comprises filling the container with 0.2× the brimful volume with a sodium bicarbonate solution having pH 8 diluted with 4 liters demineralized water, closing the container, and storing the closed container at 25° C. for 3 years.

15. The coated glass container of claim 14, wherein the coated glass container fulfills at least one of the following parameters:

leaching of [Si] ions in mg/l after storage of 3 years at pH 8 is 1.0 to 3.0 mg/l [Si] ions;

leaching of [B] ions in mg/l after storage of 3 years at pH 8 is 0.001 to 0.2 mg/l [B] ions;

leaching of [Al] ions in mg/l after storage of 3 years at pH 8 is 0.001 to 0.14 mg/l [Al] ions;

or leaching of [Ca] ions in mg/l after storage of 3 years at pH 8 is 1.0 to 4.9 mg/l [Ca] ions.

16. A coated glass container, comprising:

a glass surface; and a coating that coats at least part of the glass surface to form a coated glass surface, the coating comprising at least one layer, wherein the coated glass container fulfills the following parameter:

leaching of [Si] ions in mg/l after storage of 3 years at pH 5.5 is 1.30 mg/l [Si] ions or less;

wherein the storage of 3 years at pH 5.5 comprises filling the container with 0.2× the brimful volume of ultrapure water having a pH of 5.5, closing the container, and storing the closed container at 25° C. for 3 years.

17. The coated glass container of claim 16, wherein the coated glass container fulfills at least one of the following parameters:

leaching of [Si] ions in mg/l after storage of 3 years at pH 5.5 is 0.001 to 0.60 mg/l [Si] ions;

leaching of [B] ions in mg/l after storage of 3 years at pH 5.5 is 0.001 to 0.004 mg/l [B] ions;

leaching of [Al] ions in mg/l after storage of 3 years at pH 5.5 is 0.001 to 0.004 mg/l [Al] ions; or leaching of [Ca] ions in mg/l after storage of 3 years at pH 5.5 is 0.001 to 0.004 mg/l [Ca] ions.

* * * * *